United States Patent
Nam et al.

(10) Patent No.: US 11,222,697 B2
(45) Date of Patent: *Jan. 11, 2022

(54) THREE-DIMENSIONAL NONVOLATILE MEMORY AND METHOD OF PERFORMING READ OPERATION IN THE NONVOLATILE MEMORY

(71) Applicant: SAMSUNG ELECTRONICS CO., LTD., Suwon-si (KR)

(72) Inventors: Sang-Wan Nam, Hwaseong-si (KR); Won-Taeck Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/023,002

(22) Filed: Sep. 16, 2020

(65) Prior Publication Data

US 2020/0411097 A1  Dec. 31, 2020

Related U.S. Application Data

(63) Continuation-in-part of application No. 16/669,920, filed on Oct. 31, 2019, now Pat. No. 10,839,910.
(Continued)

(30) Foreign Application Priority Data

Feb. 28, 2013  (KR) ........................ 10-2013-0022313

(51) Int. Cl.
*G11C 16/06*  (2006.01)
*G11C 16/04*  (2006.01)
(Continued)

(52) U.S. Cl.
CPC .......... *G11C 16/0483* (2013.01); *G11C 16/08* (2013.01); *G11C 16/10* (2013.01);
(Continued)

(58) Field of Classification Search
CPC ..... G11C 16/0483; G11C 16/08; G11C 16/10; G11C 16/24; G11C 16/26; G11C 16/3427
(Continued)

(56) References Cited

U.S. PATENT DOCUMENTS 7,433,233 B2   10/2008  Chen et al.
7,495,956 B2    2/2009  Fong et al.
(Continued)

FOREIGN PATENT DOCUMENTS

KR    100842752 B1   7/2008
KR    20120000090 A  1/2012

*Primary Examiner* — Huan Hoang
(74) *Attorney, Agent, or Firm* — Volentine, Whitt & Francos, PLLC

(57) ABSTRACT

A nonvolatile memory device performs a read operation comprising first and second intervals. In the first interval the device applies a turn-on voltage to string selection lines and ground selection lines connected to the string selection transistors and the ground selection transistors, respectively. In the second interval, the device applies a turn-off voltage to unselected string selection lines and unselected ground selection lines while continuing to apply the turn-on voltage to a selected string selection line and a selected ground selection line. In both the first and second intervals, the device applies a first read voltage to a selected wordline connected to memory cells to be read by the read operation and applying a second read voltage to unselected wordlines among connected to memory cells not to be read by the read operation.

20 Claims, 26 Drawing Sheets

Related U.S. Application Data which is a continuation of application No. 16/037,190, filed on Jul. 17, 2018, now Pat. No. 10,497,444, which is a continuation of application No. 15/790,257, filed on Oct. 23, 2017, now Pat. No. 10,043,580, which is a continuation of application No. 15/203,826, filed on Jul. 7, 2016, now Pat. No. 9,799,400, which is a continuation of application No. 14/880,820, filed on Oct. 12, 2015, now Pat. No. 9,418,749, which is a continuation of application No. 14/153,164, filed on Jan. 13, 2014, now Pat. No. 9,190,151.

(51) Int. Cl.
  *G11C 16/34* (2006.01)
  *G11C 16/10* (2006.01)
  *G11C 16/26* (2006.01)
  *G11C 16/08* (2006.01)
  *G11C 16/24* (2006.01)

(52) U.S. Cl.
  CPC ............ *G11C 16/24* (2013.01); *G11C 16/26* (2013.01); *G11C 16/3427* (2013.01)

(58) Field of Classification Search
  USPC .................................................. 365/185.17
  See application file for complete search history.

(56) References Cited

U.S. PATENT DOCUMENTS

| | | |
|---|---|---|
| 7,719,902 B2 | 5/2010 | Dong et al. |
| 7,760,550 B2 | 7/2010 | Fayrushin et al. |
| 7,852,676 B2 | 12/2010 | Maejima |
| 8,107,292 B2 | 1/2012 | Maejima |
| 8,208,306 B2 | 6/2012 | Pyeon et al. |
| 8,456,918 B2 | 6/2013 | Oh et al. |
| 8,582,361 B2 | 11/2013 | Maejima |
| 8,670,285 B2 | 3/2014 | Dong et al. |
| 8,890,233 B2 | 11/2014 | Hung et al. |
| 9,190,151 B2 | 11/2015 | Nam et al. |
| 9,418,749 B2 | 8/2016 | Nam et al. |
| 9,799,400 B2 | 10/2017 | Nam et al. |
| 10,043,580 B2 | 8/2018 | Nam et al. |
| 10,497,444 B2 | 12/2019 | Nam et al. |
| 10,839,910 B2 * | 11/2020 | Nam ...................... G11C 16/26 |
| 2011/0019486 A1 | 1/2011 | Jang et al. |
| 2011/0058427 A1 | 3/2011 | Choi et al. |
| 2011/0075484 A1 | 3/2011 | Lee et al. |
| 2011/0116322 A1 | 5/2011 | Seol et al. |
| 2011/0235424 A1 | 9/2011 | Pyeon et al. |
| 2011/0317489 A1 | 12/2011 | Kim et al. |
| 2012/0020155 A1 | 1/2012 | Kim |
| 2012/0051136 A1 | 3/2012 | Kang et al. |
| 2012/0201080 A1 | 8/2012 | Kang et al. |
| 2013/0170297 A1 | 7/2013 | Nam et al. |
| 2015/0348636 A1 | 12/2015 | Choe et al. |
| 2021/0082880 A1 * | 3/2021 | Sanuki ................... H01L 25/18 |

* cited by examiner

FIG. 4

| | CS11 (Selected) | CS21 (Unselected) | CS31 (Unselected) | CS41 (Unselected) |
|---|---|---|---|---|
| SSL | VON1 (VREAD) | VON1 (VREAD) | VON2 (VP) | VON2 (VP) |
| Unselected WL | VR1 (VREAD) | | | |
| Selected WL | VR2 (VRD) | | | |
| GSL | VON1 (VREAD) | VON1 (VREAD) | VON2 (VP) | VON2 (VP) |

FIG. 5

| | CS11<br>(Selected) | CS21<br>(Unselected) | CS31<br>(Unselected) | CS41<br>(Unselected) |
|---|---|---|---|---|
| SSL | VON1<br>(VREAD) | VOFF<br>(VSS) | VOFF<br>(VSS) | VOFF<br>(VSS) |
| Unselected WL | | VR1<br>(VREAD) | | |
| Selected WL | | VR2<br>(VRD) | | |
| GSL | V1<br>(VREAD) | | VOFF<br>(VSS) | |

FIG. 9

|  | CS11 (Selected) | CS21 (Unselected) | CS31 (Unselected) | CS41 (Unselected) |
|---|---|---|---|---|
| SSL | VON1 (VREAD) | VON1 (VREAD) | VON1 (VREAD) | VON1 (VREAD) |
| Unselected WL | VR1 (VREAD) | | | |
| Selected WL | VR2 (VRD) | | | |
| GSL | VON1 (VREAD) | VON1 (VREAD) | VON1 (VREAD) | VON1 (VREAD) |

FIG. 11

| | CS11 (Selected) | CS21 (Unselected) | CS31 (Unselected) | CS41 (Unselected) |
|---|---|---|---|---|
| SSL | VON1 (VREAD) | VON1 (VREAD) | VON2 (VP) | VON2 (VP) |
| Unselected WL | VR1 (VREAD) | | | |
| Selected WL | VON3 (VP2) | | | |
| GSL | VON1 (VREAD) | VON1 (VREAD) | VON2 (VP) | VON2 (VP) |

FIG. 13

| | CS11 (Selected) | CS21 (Unselected) | CS31 (Unselected) | CS41 (Unselected) |
|---|---|---|---|---|
| SSL | VON1 (VREAD) | VON1 (VREAD) | VON1 (VREAD) | VON1 (VREAD) |
| Unselected WL | | VR1 (VREAD) | | |
| Selected WL | | VON1 (VREAD) | | |
| GSL | VON1 (VREAD) | VON1 (VREAD) | VON1 (VREAD) | VON1 (VREAD) |

FIG. 15

| | CS11 (Selected) | CS21 (Unselected) | CS31 (Unselected) | CS41 (Unselected) |
|---|---|---|---|---|
| SSL | VON2 (VP) | VON2 (VP) | VON2 (VP) | VON2 (VP) |
| Unselected WL | | VON2 (VP) | | |
| Selected WL | | VR2 (VRD) | | |
| GSL | VON2 (VP) | | | VON2 (VP) |

FIG. 17

|  | CS11 (Selected) | CS21 (Unselected) | CS31 (Unselected) | CS41 (Unselected) |
|---|---|---|---|---|
| SSL | VON2 (VP) | VON2 (VP) | VON2 (VP) | VON2 (VP) |
| Unselected WL | | VON2 (VP) | VON2 (VP) | |
| Selected WL | VON2 (VP) | | | VON2 (VP) |
| GSL | | | VON2 (VP) | |

THREE-DIMENSIONAL NONVOLATILE MEMORY AND METHOD OF PERFORMING READ OPERATION IN THE NONVOLATILE MEMORY

CROSS-REFERENCE TO RELATED APPLICATIONS

This U.S. non-provisional application is a Continuation-In-Part of U.S. patent application Ser. No. 16/669,920, filed on Oct. 31, 2019, now U.S. Pat. No. 10,839,910, which is a Continuation of U.S. Pat. No. 10,497,444, filed on Jul. 17, 2018, which is a Continuation of U.S. Pat. No. 10,043,580, filed on Nov. 16, 2017, which is a Continuation of U.S. Pat. No. 9,799,400, filed on Jul. 7, 2016, which is a Continuation of U.S. Pat. No. 9,418,749, filed on Oct. 12, 2015, which is a Continuation of U.S. Pat. No. 9,190,151, filed on Jan. 13, 2014, which claims priority under 35 U.S.C. § 119 to Korean Patent Application No. 10-2013-0022313, filed on Feb. 28, 2013, the subject matter of which is hereby incorporated by reference.

BACKGROUND OF THE INVENTION

The inventive concept relates generally to semiconductor memory devices, and more particularly, to nonvolatile memory devices and related methods for performing read operations with reduced read disturbance.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random access memory (SRAM) devices, dynamic random access memory (DRAM) devices, and synchronous DRAM (SDRAM) devices. Examples of nonvolatile memory devices include flash memory devices, read only memory (ROM) devices, programmable ROM (PROM) devices, electrically erasable and programmable ROM (EEPROM) devices, and various forms of resistive memory such as phase-change RAM (PRAM), ferroelectric RAM (FRAM), and resistive RAM (RRAM).

In recent years, researchers have developed three-dimensional (3D) semiconductor memory devices in an effort to increase the integration density of semiconductor memory devices. Structural characteristics of 3D semiconductor memory devices are different from those of two-dimensional (2D) semiconductor memory devices, so they require different driving methods compared to the 2D semiconductor memory devices. For example, due to their different structural characteristics, the 3D semiconductor memory devices may experience different electrical parasitics, which may require driving voltages to be provided with different levels and timing compared to 2D semiconductor memory devices.

SUMMARY OF THE INVENTION

In one embodiment of the inventive concept, a method is provide for performing a read operation in a nonvolatile memory comprising a memory cell region and a peripheral circuit region, the memory cell region comprising multiple cell strings each comprising multiple memory cells stacked in a direction perpendicular to a substrate, a ground selection transistor disposed between the memory cells and the substrate, and a string selection transistor disposed between the memory cells and a bitline. During a first interval, the method applies, by the peripheral circuit region to the memory cell region, a first turn-on voltage to string selection lines connected to string selection transistors of a first group of cell strings among the multiple cell strings, and to a first ground selection line connected in common to ground selection transistors of the first group of cell strings, and applies, by the peripheral circuit region to the memory cell region, a second turn-on voltage to string selection lines connected to string selection transistors of a second group of cell strings among the multiple cell strings, and to a second ground selection line connected in common to ground selection transistors of the second group of cell strings. During a second interval following the first interval, the method applies, by the peripheral circuit region to the memory cell region, the first turn-on voltage to a string selection line of a selected cell string among the first group of cell strings, and to the first ground selection line, and applies, by the peripheral circuit region to the memory cell region, a turn-off voltage to string selection lines of unselected cell strings among the first group of cell strings, to string selection lines of cell strings in the second group of cell strings, and to the second ground selection line. During both the first and second intervals, the method applies, by the peripheral circuit region to the memory cell region, a first read voltage to a selected wordline among wordlines connected to memory cells of the first group of cell strings and the second group of cell strings, and applies, by the peripheral circuit region to the memory cell region, a second read voltage to unselected wordlines among the wordlines connected to memory cells of the first group of cell strings and the second group of cell strings of the wordlines. The memory cell region further comprises first metal pads. The peripheral circuit region comprises second metal pads and is vertically connected to the memory cell region by the first metal pads and the second metal pads.

In another embodiment of the inventive concept, a nonvolatile memory comprises a memory cell region comprising first metal pads and a memory cell array, the a memory cell array comprising multiple cell strings each cell string comprising multiple memory cells stacked in a direction perpendicular to a substrate, a ground selection transistor disposed between the memory cells and the substrate, and a string selection transistor disposed between the memory cells and a bitline, and a peripheral circuit region. The peripheral circuit region comprises second metal pads, an address decoder connected to multiple memory cells of the cell strings through wordlines, to string selection transistors of the cell strings through string selection lines, and to ground selection transistors of the cell strings through ground selection lines, and a read/write circuit connected to string selection transistors of the cell strings through bitlines. In a read operation, the address decoder applies a turn-on voltage to string selection lines and ground selection lines connected to the string selection transistors and ground selection transistors, respectively, and then applies a turn-off voltage to unselected string selection lines and unselected ground selection lines among the string selection lines and ground selection lines while continuing to apply the turn-on voltage to a selected string selection line and a selected ground selection line among the string selection lines and ground selection lines. The peripheral circuit region is vertically connected to the memory cell region by the first metal pads and the second metal pads In another embodiment of the inventive concept, a method is provided for performing a read operation in a nonvolatile memory comprising a memory cell region and a peripheral circuit region, the memory cell region comprising multiple cell strings each comprising multiple memory cells stacked in a direction perpendicular to a substrate, a ground selection transistor disposed between the memory cells and the substrate, and a string selection transistor disposed between the memory cells and a bitline. In a first interval of the read operation, the method applies, by the peripheral circuit region to the memory cell region, a turn-on voltage to string selection lines and ground selection lines connected to the string selection transistors and the ground selection transistors, respectively. In a second interval following the first interval, the method applies, by the peripheral circuit region to the memory cell region, a turn-off voltage to unselected string selection lines and unselected ground selection lines among the string selection lines and ground selection lines while continuing to apply the turn-on voltage to a selected string selection line and a selected ground selection line among the string selection lines and ground selection lines. In both the first and second intervals, the method applies, by the peripheral circuit region to the memory cell region, a first read voltage to a selected wordline connected to memory cells to be read by the read operation and applying a second read voltage to unselected wordlines among connected to memory cells not to be read by the read operation. The memory cell region further comprises first metal pads. The peripheral circuit region comprises second metal pads and is vertically connected to the memory cell region by the first metal pads and the second metal pads.

These and other embodiments of the inventive concept can potentially reduce read disturbances by turning on various string and ground selection transistors in a predetermined order and with predetermined levels such that boosted charges are discharged through the string and ground selection transistors and a potential distribution in different cell strings becomes substantially uniform.

BRIEF DESCRIPTION OF THE DRAWINGS

The drawings illustrate selected embodiments of the inventive concept. In the drawings, like reference numbers indicate like features.

FIGS. 4 and 5 are diagrams illustrating a first example of voltages that can be used in the method of FIG. 3.

FIG. 9 is a diagram of a second example of voltages that can be used in the method of FIG. 3.

FIG. 11 is a diagram of a third example of voltages that can be used in the method of FIG. 3.

FIG. 13 is a diagram of a fourth example of voltages that can be used in the method of FIG. 3.

FIG. 15 is a diagram of a fifth example of voltages that can be used in the method of FIG. 3.

FIG. 17 is a diagram of a sixth example of voltages that can be used in the method of FIG. 3.

DETAILED DESCRIPTION

Figure 1:
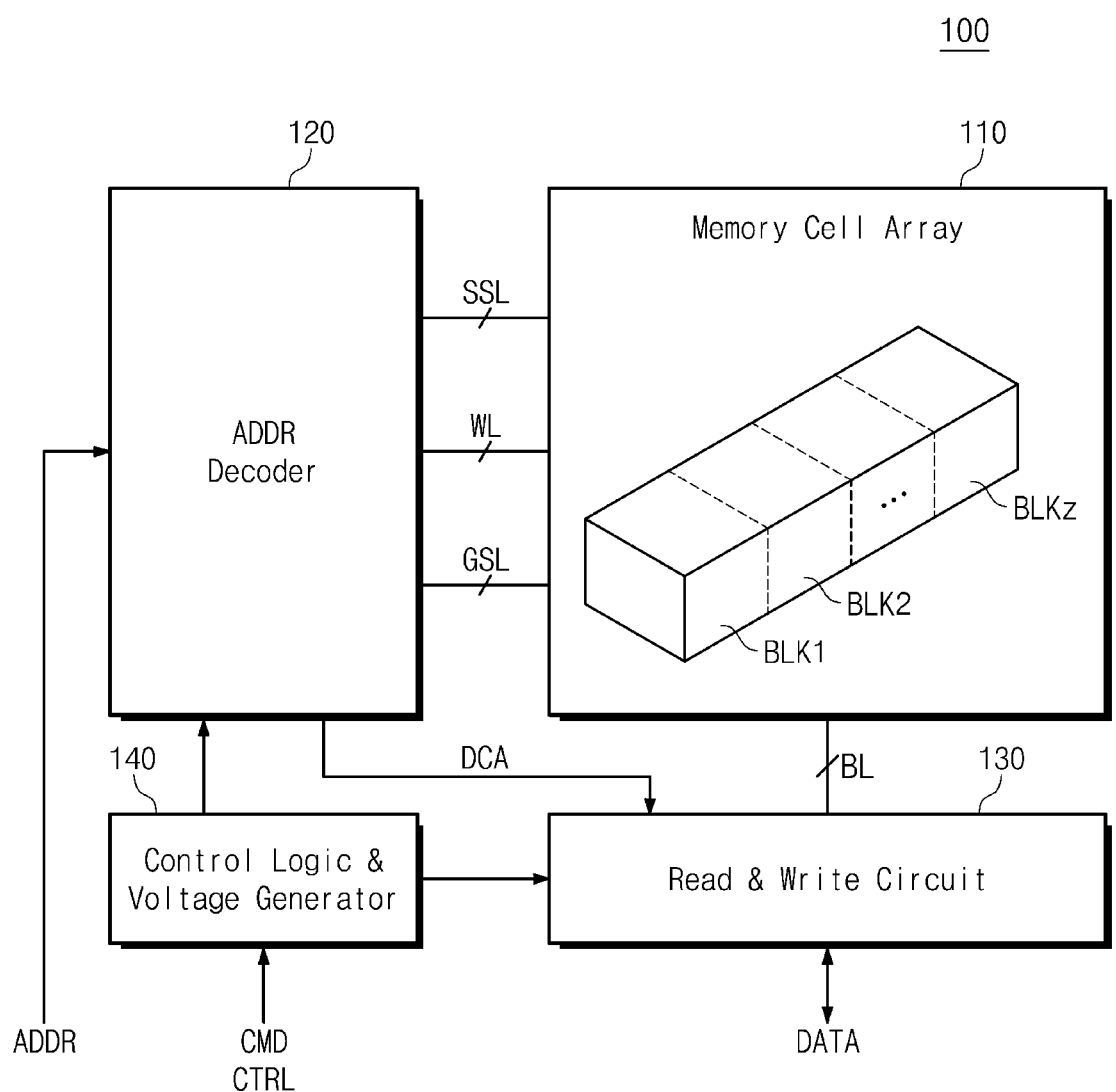
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but these features should not be limited by these terms. Rather, these terms are used merely to distinguish between different features. Thus, a first feature could be termed a second feature without departing from the teachings of the inventive concept.

Spatially relative terms, such as "beneath", "below", "lower", "under", "above", "upper" and the like, may be used for ease of description to describe one feature's relationship to another feature(s) as illustrated in the figures. The spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that where a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. Terms such as "comprises" and/or "comprising," where used in this specification, indicate the presence of stated features but do not preclude the presence or addition of one or more other features. As used herein, the term "and/or" includes any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

The term "selected memory block" denotes a memory block selected for programming, erasing, or reading, from among multiple memory blocks. The term "selected sub block" denotes a sub block selected for programming, erasing, or reading, from among multiple sub blocks in one memory block.

The term "selected bitline" or "selected bitlines" denotes a bitline or bitlines connected to a cell transistor to be programmed or read, from among multiple bitlines. The term "unselected bitline" or "unselected bitlines" denotes a bitline or bitlines connected to a cell transistor to be program-inhibited or read-inhibited, from among multiple bitlines.

The term "selected string selection line" denotes a string selection line connected to a cell string including a cell transistor to be programmed or read, from among multiple string selection lines. The term "unselected string selection line" or "unselected string selection lines" denotes a remaining string selection line or remaining string selection lines other than the selected string selection line from among multiple string selection lines. The term "selected string selection transistors" denotes string selection transistors connected to a selected string selection line. The term "unselected string selection transistors" denotes string selection transistors connected to an unselected string selection line or unselected string selection lines.

The term "selected ground selection line" denotes a ground selection line connected to a cell string including a cell transistor to be programmed or read, among multiple ground selection lines. The term "unselected ground selection line" denotes a remaining ground selection line or remaining ground selection lines other than the selected ground selection line from among multiple ground selection lines. The term "selected ground selection transistors" denotes ground selection transistors connected to a selected ground selection line. The term "unselected ground selection transistors" denotes ground selection transistors connected to an unselected ground selection line or unselected ground selection lines.

The term "unselected wordline" denotes a wordline, connected to a cell transistor to be programmed or read, from among multiple wordlines. The term "unselected wordline" or "unselected wordlines" denotes a remaining wordlines or remaining wordlines other than a selected wordline from among multiple wordlines.

The term "selected memory cell" or "selected memory cells" denotes memory cells to be programmed or read among multiple memory cells. The term "unselected memory cell" or "unselected memory cells" denotes a remaining memory cell or remaining memory cells other than a selected memory cell or selected memory cells from among multiple memory cells.

Embodiments of the inventive concept will be described with reference to a NAND flash memory. However, the inventive concept is not limited thereto. For example, the inventive concept may also be applied to nonvolatile memory devices such as an EEPROM, a NOR flash memory, PRAM, a Magnetic RAM (MRAM), RRAM, an FRAM, and the like.

FIG. 1 is a block diagram of a nonvolatile memory device 100 according to an embodiment of the inventive concept.

Referring to FIG. 1, nonvolatile memory device 100 comprises a memory cell array 110, an address decoder 120, a read/write circuit 130, and control logic and voltage generator block 140.

Memory cell array 110 is connected to address decoder 120 through wordlines WL, string select lines SSL, and ground selection lines GSL and to read/write circuit 130 through bitlines BL. Memory cell array 110 comprises multiple memory blocks BLK1 to BLKz, each of which multiple memory cells and multiple selection transistors. The memory cells are connected to the wordlines, and the selection transistors are connected to string select lines SSL or ground selection lines GSL. The memory cells of each memory block are stacked in a direction perpendicular to a substrate to form a 3D structure. Each memory cell stores one or more bits.

Address decoder 120 is connected to memory cell array 110 through wordlines WL, string select lines SSL, and ground selection lines GSL. Address decoder 120 operates under control of control logic and voltage generator block 140. Address decoder 120 receives an address ADDR from an external device.

Address decoder 120 is configured to decode a row address of the received address ADDR. Address decoder 120 selects wordlines WL, string select lines SSL, and ground selection lines GSL based on the decoded row address. Address decoder 120 receives various voltages from control logic and voltage generator block 140 and transfers the received voltages to selected and unselected string selection lines SSL, wordlines WL and ground selection lines GSL.

Address decoder 120 is configured to decode a column address of the received address ADDR. Address decoder 120 transfers decoded column address DCA to read/write circuit 130. For example, address decoder 120 may comprise features such as a row decoder, a column address, an address buffer, and so on.

Read/write circuit 130 is connected to memory cell array 110 through bitlines BL, and it exchanges data with the external device. Read/write circuit 130 operates under control of control logic and voltage generator block 140. Read/write circuit 130 receives decoded column address DCA from address decoder 120, and it selects bitlines BL using the decoded column address.

Read/write circuit 130 receives data from the external device, and it writes the received data at memory cell array 110. Read/write circuit 130 reads data from memory cell array 110 and transfers the read data to the external device. Read/write circuit 130 reads data from a first storage region of memory cell array 110 and writes the read data to a second storage region of memory cell array 110. For instance, read/write circuit 130 may perform a copy-back operation.

Read/write circuit 130 typically comprises features such as a page buffer (or, page register), a column selection circuit, a data buffer, and so on. In some embodiments, read/write circuit 130 may also include features such as a sense amplifier, a write driver, a column selection circuit, a data buffer, and so on.

Control logic and voltage generator block 140 is connected to address decoder 120 and read/write circuit 130. Control logic and voltage generator block 140 is configured to control operations of nonvolatile memory device 100. Control logic and voltage generator block 140 is generally configured to generate various voltages used by nonvolatile memory device 100. Control logic and voltage generator block 140 operates in response to a control signal CTRL and a command CMD transferred from the external device.

Figure 2:
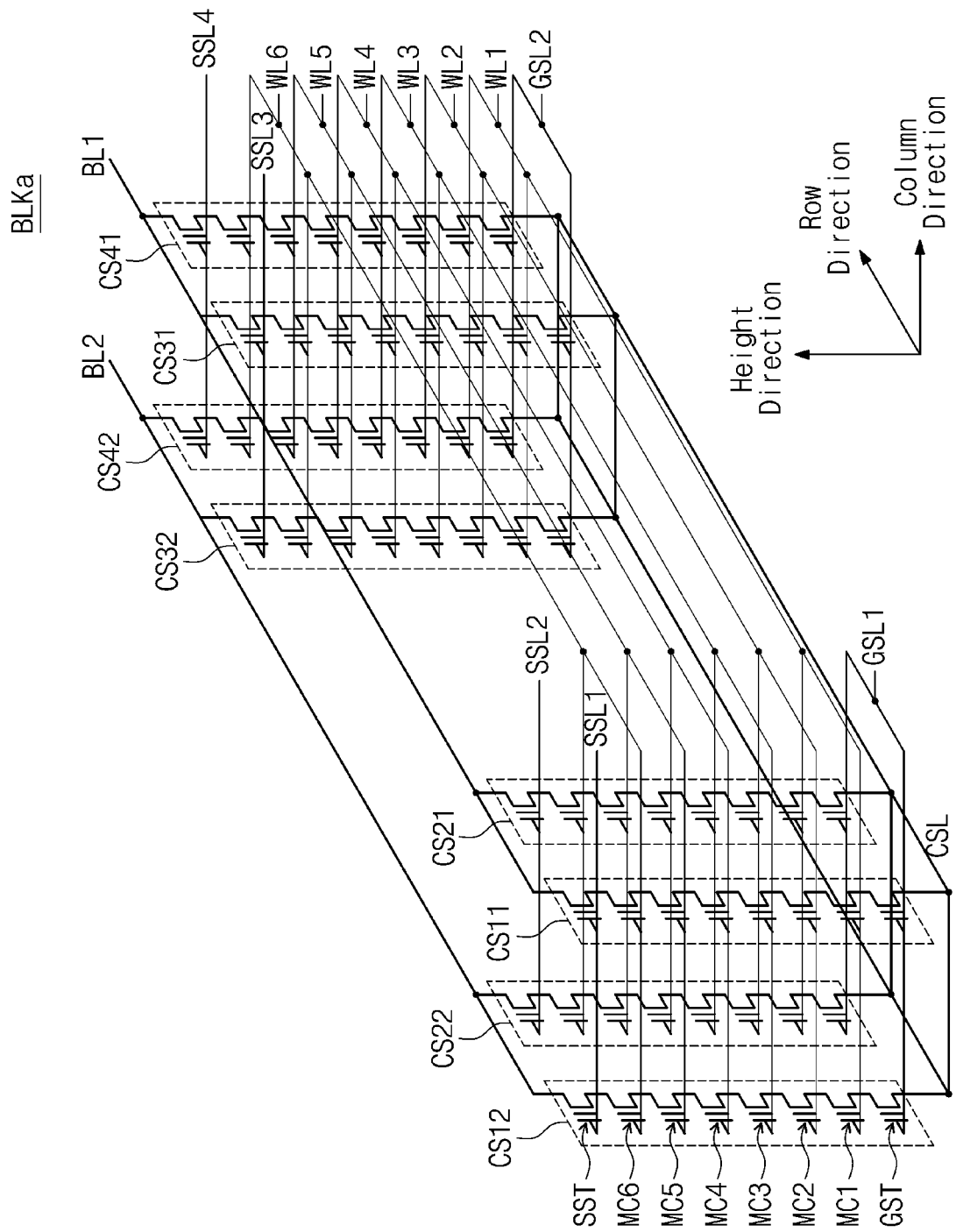
FIG. 2 is a circuit diagram of a memory block according to an embodiment of the inventive concept.

FIG. 2 is a circuit diagram of a memory block BLKa according to an embodiment of the inventive concept. Memory block BLKa is a representative example of one of memory blocks BLK1 to BLKz of memory cell array 110 of FIG. 1.

Referring to FIGS. 1 and 2, memory block BLKa comprises multiple cell strings CS11 to CS41 and CS12 to CS42. Cell strings CS11 to CS41 and CS12 to CS42 are arranged along a row direction and a column direction and form rows and columns.

Each of cell strings CS11 to CS41 and CS12 to CS42 comprises a ground selection transistor GST, memory cells MC1 to MC6, and a string selection transistor SST. In each of cell strings CS11 to CS41 and CS12 to CS42, ground selection transistor GST, memory cells MC1 to MC6, and string selection transistor SST may be stacked in a height direction perpendicular to a substrate.

Rows of cell strings CS11 to CS41 and CS12 to CS42 are connected to different string selection lines SSL1 to SSL4, respectively. For example, string selection transistors SST in cell strings CS11 and CS12 are connected in common to string selection line SSL1, and string selection transistors SST in cell strings CS21 and CS22 are connected in common to string selection line SSL2. String selection transistors SST in cell strings CS31 and CS32 are connected in common to string selection line SSL3, and string selection transistors SST in cell strings CS41 and CS42 are connected in common to string selection line SSL4.

Columns of cell strings CS11 to CS41 and CS12 to CS42 are connected to different bitlines BL1 and BL2, respectively. For example, string selection transistors SST in cell strings CS11 to CS41 are connected in common to bitline BL1, and string selection transistors SST in cell strings CS12 to CS42 are connected in common to bitline BL2.

At least two rows of cell strings are connected in common to a ground selection line, and cell strings CS11 to CS41 and CS12 to CS42 are connected to at least two different ground selection lines GSL1 and GSL2. For example, ground selection transistors GST of cell strings CS11, CS21, CS12, and CS22 are connected in common to ground selection line GSL1, and ground selection transistors GST of cell strings CS31, CS41, CS32, and CS42 are connected in common to ground selection line GSL2.

Memory cells at the same height from a substrate (or, ground selection transistors GST) are connected in common to a wordline, and memory cells at different heights are connected to different wordlines. For example, memory cells MC1 are connected in common to a wordline WL1, and memory cells MC2 are connected in common to a wordline WL2. Memory cells MC3 are connected in common to a wordline WL3, and memory cells MC4 are connected in common to a wordline WL4. Memory cells MC5 are connected in common to a wordline WL5, and memory cells MC6 are connected in common to a wordline WL6. Ground selection transistors GST of cell strings CS11 to CS41 and CS12 to CS42 are connected in common to a common source line CSL.

Memory block BLKa illustrated in FIG. 2 is merely an example, and the inventive concept is not limited to the features of this memory block. For example, the number of rows of cell strings may be increased or decreased. As the number of rows of cell strings is varied, the number of string selection lines connected to rows of cell strings and the number of cell strings connected to a bitline may be also changed. As the number of rows of cell strings is varied, the number of ground selection lines connected to at least two rows of cell strings may be also changed.

The number of columns of cell strings may be increased or decreased. As the number of columns of cell strings is varied, the number of bitlines connected to columns of cell strings and the number of cell strings connected to a string selection line may be also changed.

The height of cell strings may be increased or decreased. For example, the number of stacked memory cells in each cell string may be increased or decreased. In this case, the number of wordlines may be also changed. For example, the number of ground or string selection transistors in each cell string may increase. In this case, the number of ground or string selection lines may be also changed. If the number of ground or string selection transistors increases, ground or string selection transistors may be stacked substantially the same as such a manner that the memory cells are stacked.

In some embodiments, a read operation and a write operation may be performed by a unit of a row of cell strings. Cell strings CS11 to CS41 and CS12 to CS42 may be selected by a two-row unit by ground selection lines GSL1 and GSL2 and by a row unit by string selection lines SSL1 to SSL4.

In a selected row of cell strings, the read operation and the write operation may be performed by a page unit. A page may be a row of memory cells connected to a wordline. In a selected row of cell strings, memory cells may be selected by a page unit by wordlines WL1 to WL6.

Figure 3:
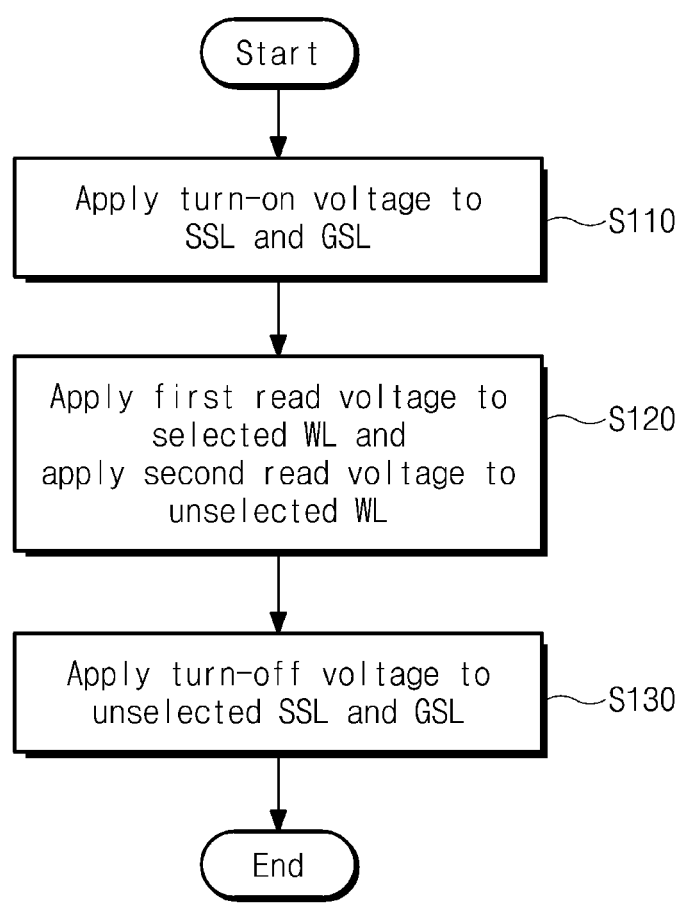
FIG. 3 is a flowchart illustrating a method of performing a read operation in a nonvolatile memory according to an embodiment of the inventive concept.

FIG. 3 is a flowchart illustrating a read method of a nonvolatile memory 100 according to an embodiment of the inventive concept.

Referring to FIGS. 2 and 3, in operation S110, a turn-on voltage is applied to string selection lines SSL1 and SSL4 and ground selection lines GSL1 and GSL2. In operation S120, a first read voltage is applied to a selected wordline, and a second read voltage is applied to unselected wordlines. The first read voltage and the second read voltage may be simultaneously applied. In operation S130, a turn-off voltage is applied to unselected string selection lines and unselected ground selection lines.

Various examples of the timing and voltage levels to be used in connection with operations S110 through S130 will be presented with reference to FIG. 4 through 18 below.

FIGS. 4 and 5 are diagrams illustrating a first example of voltages that can be used in the method of FIG. 3. The voltages illustrated in FIG. 4 are applied to cell strings CS11 to CS41 in a first interval of a read operation, and the voltages illustrated in FIG. 5 are applied to cell strings CS11 to CS41 in a second interval of the read operation following the first interval.

In FIGS. 4 and 5, as well as similar diagrams such as those in FIGS. 9, 11, 13, 15, and 17, specific cell strings are labeled along an upper x-axis, and various signal lines are labeled along a left y-axis. The signal lines corresponding to those cell strings are written in a generic form, i.e., SSL rather than SSL1, SSL2, etc.; GSL rather than GSL1, GSL2, etc.; and so on. Their specific form can be inferred from FIG. 2 in combination with the relevant cell string labels. For instance, cell string CS11 corresponds to string selection line SSL1 and ground selection line GSL1, cell string CS41 corresponds to string selection line SSL4 and ground selection line GSL2, and so on.

Shading is used in FIG. 5 to indicate voltages that change between the first and second intervals of FIGS. 4 and 5. Although FIGS. 4 and 5 illustrate voltages applied to a first row of cell strings CS11 to CS41, the same voltages is applied to a second row of cell strings CS12 to CS42.

Referring to FIG. 4, cell string CS11 is selected, and cell strings CS21 to CS41 are unselected. A turn-on voltage is applied to string selection lines SSL1 to SSL4 and ground selection lines GSL1 and GSL2. The turn-on voltage is a voltage for turning on string and ground selection transistors SST and GST.

In further detail, a first turn-on voltage VON1 is applied to a selected ground selection line GSL1 connected to the selected cell string CS11, and a second turn-on voltage is applied to an unselected ground selection line GSL2.

First turn-on voltage VON1 is applied to a selected string selection line SSL1 connected to the selected cell string CS11. First turn-on voltage VON1 is applied to an unselected string selection line SSL2 corresponding to the selected ground selection line GSL1. In other words, first turn-on voltage VON1 is applied to both a string selection line of a selected cell string, as well as a string selection line of an unselected cell string that shares a ground selection line with the selected cell string. Second turn-on voltage VON2 is applied to unselected string selection lines SSL3 and SSL4 corresponding to the unselected ground selection line GSL2.

In the illustrated examples, first turn-on voltage VON1 is a read voltage VREAD, which is a high voltage. Read voltage VREAD has a level sufficient to turn on memory cell transistors, string selection transistors, or ground selection transistors, regardless of whether those transistors are in a programmed state. Second turn-on voltage VON2 is a positive voltage VP lower than read voltage VREAD.

A first read voltage VR1 is applied to unselected wordlines. First read voltage VR1 is also read voltage VREAD. A second read voltage VR1 is applied to a selected wordline. Second read voltage VR1 is a selection read voltage VRD for determining program states of memory cells MC1 to MC6. Selection read voltage VRD may have one of various voltage levels used to determine threshold voltage distributions according to program states of memory cells MC1 to MC6.

Referring to FIG. 5, a turn-off voltage VOFF is applied to unselected string selection lines SSL2 to SSL4 and the unselected ground selection line GSL2. The turn-off voltage VOFF is a voltage with a level sufficient to turn off the string and ground selection transistors SST and GST. For example, the turn-off voltage VOFF may be a ground voltage VSS.

Figure 6:
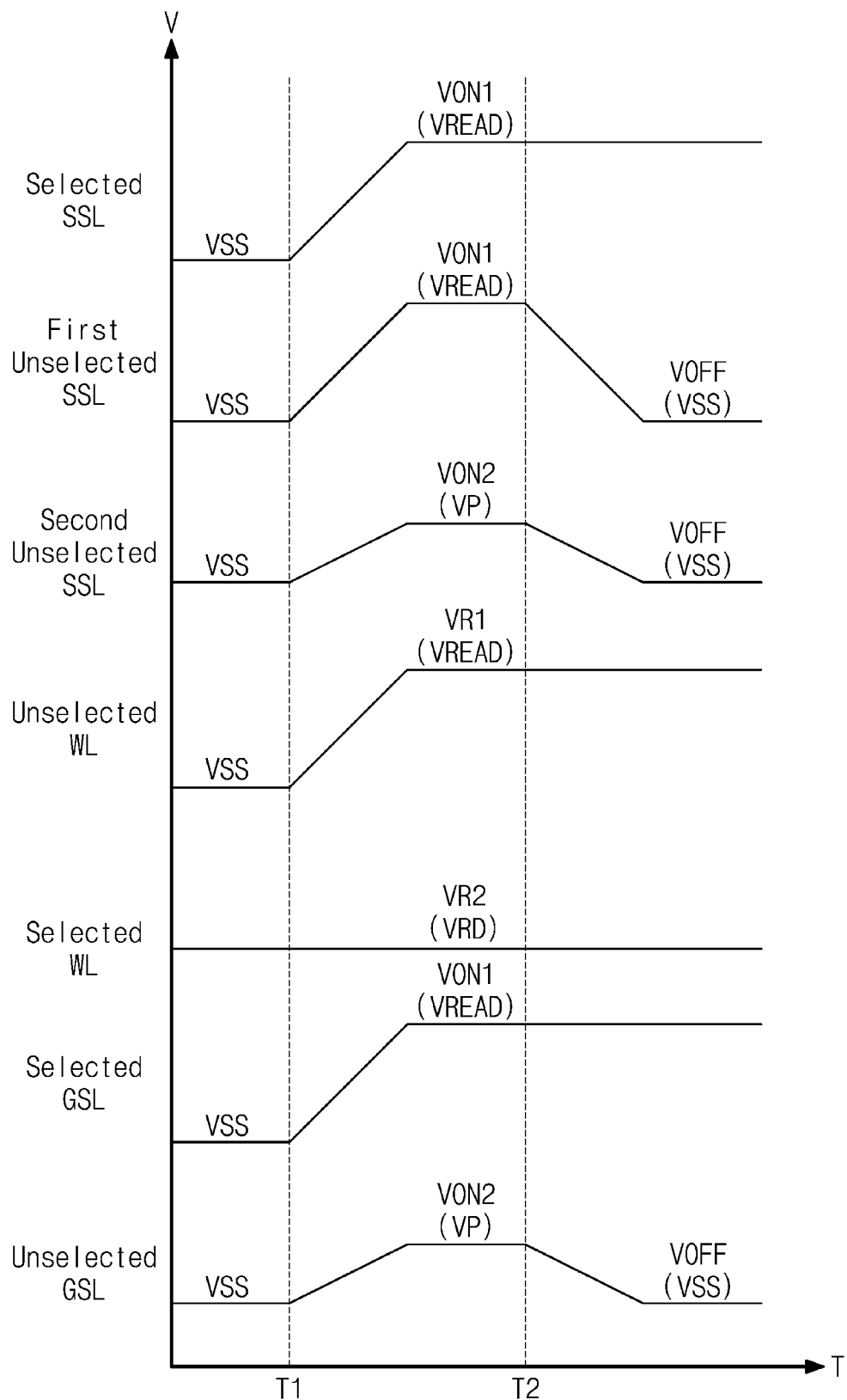
FIG. 6 is a timing diagram of an example read operation using the voltages illustrated in FIGS. 4 and 5.

FIG. 6 is a timing diagram of an example read operation using the voltages illustrated in FIGS. 4 and 5. In FIG. 6, the first interval of FIG. 4 is between a time T1 and a time T2, and the second interval of FIG. 5 is after time T2.

Referring to FIG. 6, at time T1, first turn-on voltage VON1 is applied to selected string selection line SSL1. First turn-on voltage VON1 is also applied to a first unselected string selection line. The first unselected string selection line may be an unselected string selection line SSL2 corresponding to a selected ground selection line GSL1. Second turn-on voltage VON2 is applied to second unselected string selection lines. The second unselected string selection lines may be unselected string selection lines SSL3 and SSL4 corresponding to unselected ground selection line GSL2.

First read voltage VR1 is applied to an unselected wordline, and second read voltage VR2 is applied to a selected wordline. For example, second read voltage VR2 may be ground voltage VSS. First turn-on voltage VON1 is applied to the selected ground selection line GSL1, and second turn-on voltage VON2 is applied to the unselected ground selection line GSL2.

At time T2, turn-off voltage VOFF is applied to the first unselected string selection line SSL2 and second unselected string selection lines SSL3 and SSL4. The turn-off voltage VOFF is applied to the unselected ground selection line GSL2. Voltages of the selected string selection line SSL1, the selected ground selection line GSL1, the selected wordline and the unselected wordlines may be maintained between the first and second intervals.

Figure 7:
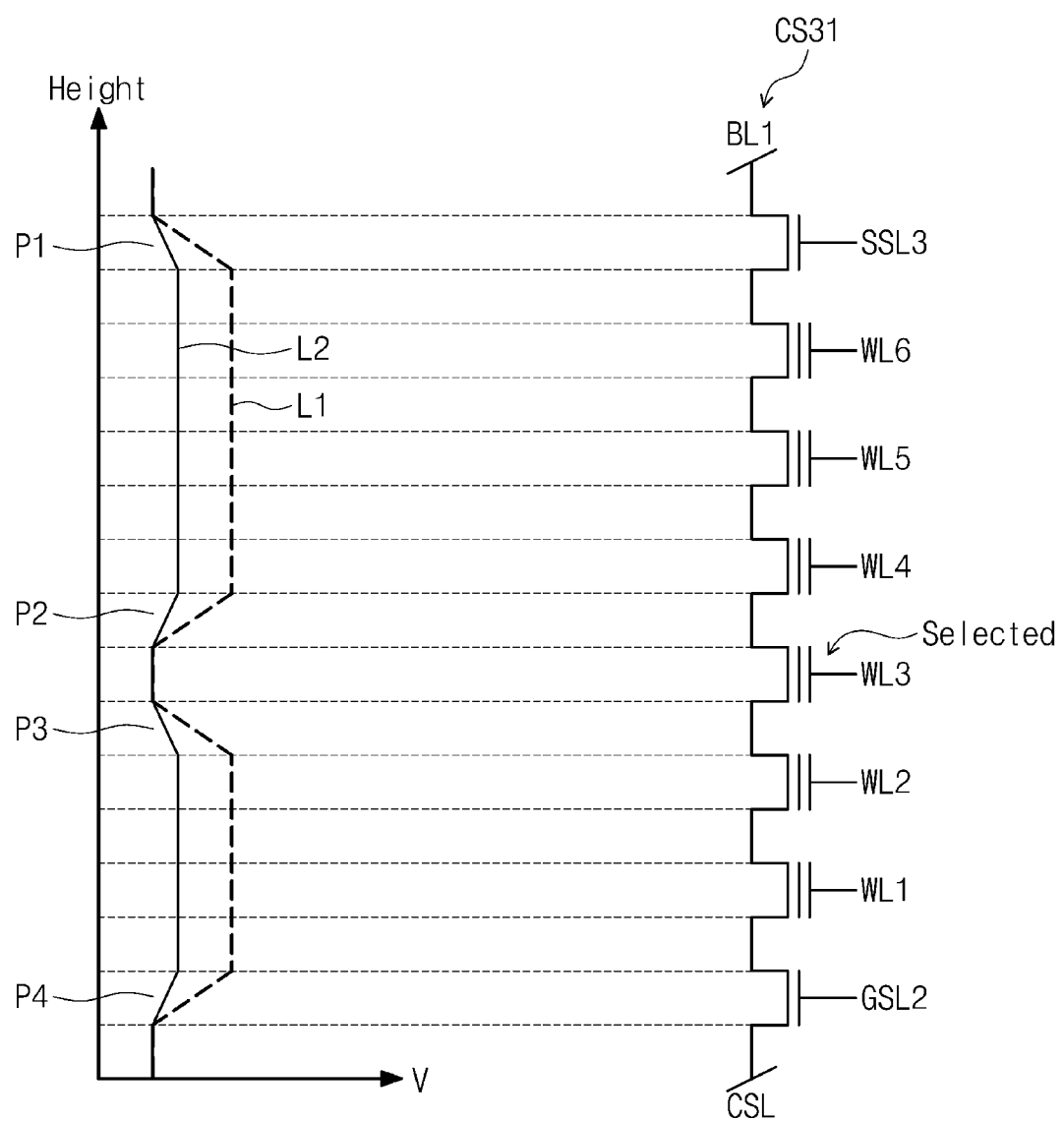
FIG. 7 is a diagram of a channel voltage of a cell string CS31 when a read operation is performed using the voltages illustrated in FIGS. 4 to 6.

FIG. 7 is a diagram of a channel voltage of a cell string CS31 when voltages are applied according to FIGS. 4 to 6.

Referring to FIG. 7, a cell string CS31 connected to an unselected ground selection line GSL2 and an unselected string selection line SSL3 and a channels voltage of cell string CS31 are illustrated. A horizontal axis indicates a channel voltage, and a vertical axis indicates a height. A first line L1 shown in dotted line represents a channel voltage in a device using a conventional read method, and a second line L2 shown in solid line represents a channel voltage in a device using the voltages of FIGS. 4 to 6.

In the conventional read method, a turn-on voltage is not applied to an unselected ground selection line GSL2 and second unselected string selection lines SSL3 and SSL4 in a first interval. Thus, a string selection transistor SST and a ground selection transistor GST in cell string CS31 maintain a turn-off state. A string channel of cell string CS31 may be floated.

A first read voltage VR1 is applied to unselected wordlines WL1, WL2, and WL4 to WL6. At this time, coupling is generated between the unselected wordlines WL1, WL2, and WL4 to WL6 and memory cells MC1 to MC6. Voltages of channels of memory cells MC1, MC2, and MC4 to MC6 may be boosted by the coupling as illustrated by the first line L1.

At a point P1, a potential difference is generated between a bitline BL1 and a channel of memory cell MC6. At a point P2, a potential difference is generated between channels of memory cells MC4 and MC3. At a point P3, a potential difference is generated between channels of memory cells MC3 and MC2. At a point P4, a potential difference is generated between a channel of memory cell MC6 and a common source line CSL.

The potential difference may cause generation of hot electrons at points P1 to P4. The hot electrons may be accumulated at memory cells MC1 to MC6, string selection transistor SST or ground selection transistor GST. The accumulated hot electrons may cause variations in threshold voltages of memory cells MC1 to MC6, a threshold voltage of string selection transistor SST or a threshold voltage of ground selection transistor GST. That is, potential differences at points P1 to P4 may cause read disturbances.

According to an embodiment of the inventive concept, second turn-on voltage VON2 is applied to the second unselected string selection lines SSL3 and SSL4 and the unselected ground selection line GSL2 at the same time when first read voltage VR1 is applied to the unselected wordlines WL1, WL2, and WL4 to WL6. If second turn-on voltage VON2 is applied, string selection transistor SST and ground selection transistor GST may be turned on.

A channel voltage corresponding to memory cells MC4 to MC6 is discharged to bitline BL1 through string selection transistor SST. A channel voltage corresponding to memory cells MC1 and MC2 is discharged to common source line CSL through ground selection transistor GST. Thus, channel voltages of memory cells MC1, MC2, and MC4 to MC6 connected to the unselected wordlines WL1, WL2, and WL4 to WL6 may be lowered, so that read disturbance is prevented or reduced.

Also, voltages applied to the second unselected string selection lines SSL3 and SSL4 and the unselected ground selection line GSL2 may be equal to second turn-on voltage VON2. A channel voltage corresponding to memory cells MC1 and MC2 and a channel voltage corresponding to memory cells MC4 to MC6 may be leveled. If channel voltages at both sides of a memory cell MC3 connected to a selected wordline WL3 are leveled, the probability that hot electrons are generated at memory cell MC3 may be reduced. Thus, read disturbance may be prevented or reduced.

Figure 8:
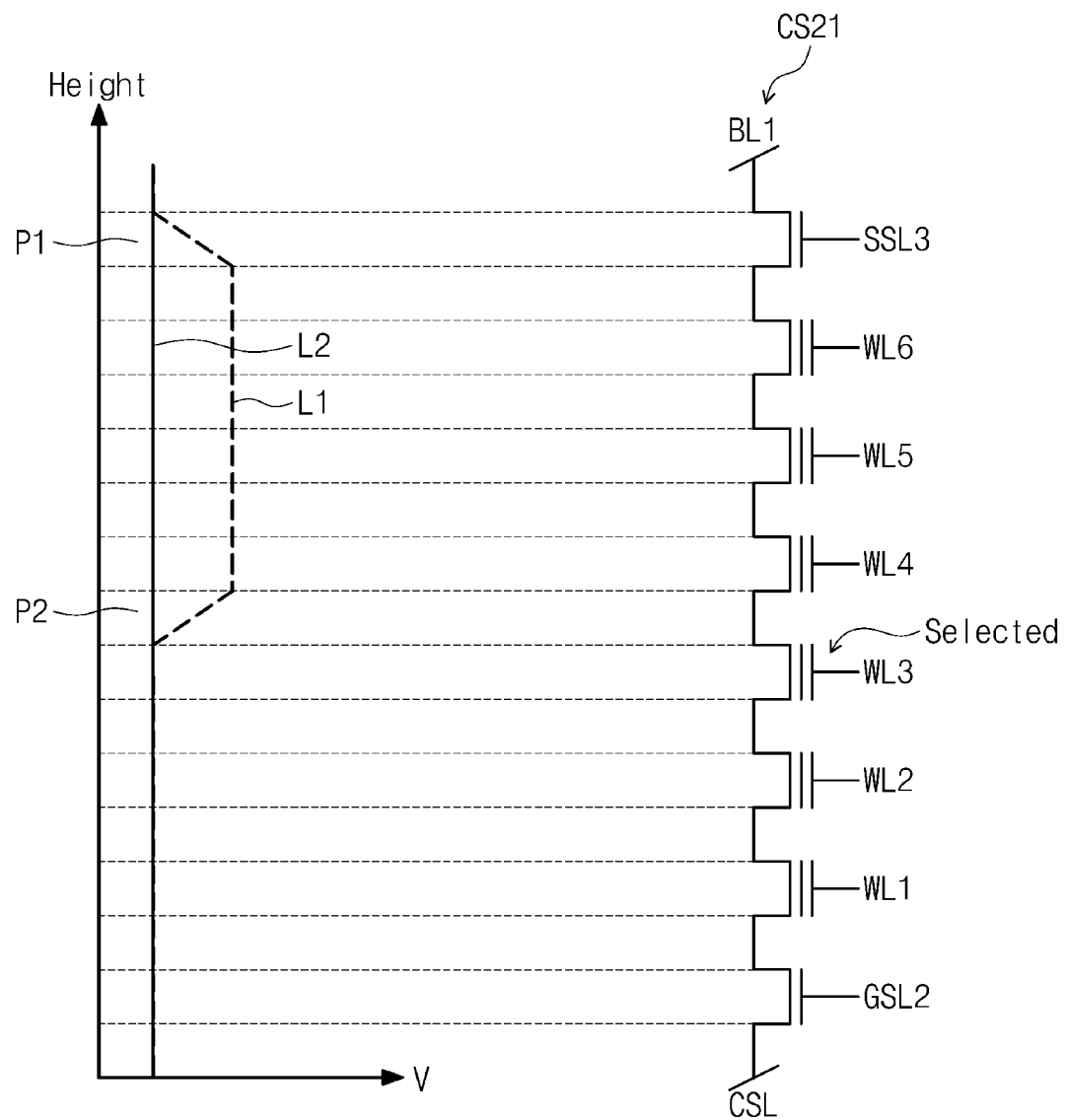
FIG. 8 is a diagram of a channel voltage of a cell string CS21 when a read operation is performed using the voltages illustrated in FIGS. 4 to 6.

FIG. 8 is a diagram of a channel voltage of a cell string CS21 when voltages are applied according to FIGS. 4 to 6.

In FIG. 8, a cell string CS21 connected to a selected ground selection line GSL1 and an unselected string selection line SSL2 and a channels voltage of cell string CS31 are illustrated. In FIG. 8, a horizontal axis indicates a channel voltage, and a vertical axis indicates a height. In FIG. 7, a first line L1 shown in dotted line shows a channel voltage of a conventional read method, and a second line L2 shown in solid line shows a channel voltage produced by the voltages of FIGS. 4 to 6.

In the conventional read method, a turn-on voltage is not applied to the selected ground selection line GSL1, and is not be applied to the unselected string selection line SSL2. Thus, a string selection transistor SST in cell string CS21 maintains a turn-off state, and a ground selection transistor GST in cell string CS21 is turned on.

As a first read voltage VR1 is applied to unselected wordlines WL1 and WL2, channels of memory cells MC1 and MC2 are connected to a common source line CSL through a ground selection transistor GST. Because a second read voltage VR2 is applied to a selected wordline WL3, channels of memory cells MC4 to MC6 may be floated. Channel voltages of memory cells MC4 to MC6 may be boosted by first read voltage VR1 applied to wordlines WL4 to WL6.

Thus, as shown in first line L1, channel voltages of memory cells MC1 to MC2 may be discharged to a common source line CSL to maintain a low voltage. Channel voltages of memory cells MC4 to MC6 may be boosted.

At point P1, a potential difference is generated between a bitline BL1 and a channel of memory cell MC6. At point P2, a potential difference is generated between channels of memory cells MC4 and MC3.

The potential differences existing at points P1 and P2 may cause generation of hot electrons. The hot electrons may be accumulated at memory cells MC1 to MC6, string selection transistor SST or ground selection transistor GST. The accumulated hot electrons may cause a variation in threshold voltages of memory cells MC1 to MC6, a threshold voltage of string selection transistor SST or a threshold voltage of ground selection transistor GST. That is, potential differences generated at points P1 and P2 causes read disturbances.

According to an embodiment of the inventive concept, first turn-on voltage VON1 is applied to the unselected string selection line SSL1 at the same time when first read voltage VR1 is applied to the unselected wordlines WL1, WL2, and WL4 to WL6 and first turn-on voltage VON1 is applied to the unselected string selection line SSL1. If first turn-on voltage VON1 is applied, string selection transistor SST and ground selection transistor GST may be turned on.

A channel voltage corresponding to memory cells MC4 to MC6 is discharged to bitline BL1 through string selection transistor SST. Thus, channel voltages of memory cells MC4 to MC6 connected to the unselected wordlines WL4 to WL6 may be lowered, so that read disturbance is prevented or reduced.

Also, voltages applied to the unselected string selection line SSL1 and the selected ground selection line GSL1 may be equal to first turn-on voltage VON1. Thus, a channel voltage corresponding to memory cells MC1 and MC2 and a channel voltage corresponding to memory cells MC4 to MC6 may be leveled. If channel voltages at both sides of a memory cell MC3 connected to a selected wordline WL3 are leveled, the probability that hot electrons are generated at memory cell MC3 may be reduced. Thus, read disturbance may be prevented or reduced.

FIG. 9 is a diagram of a second example of voltages that can be used in the method of FIG. 3. Compared to FIG. 4, first turn-on voltage VON1 is applied to string selection lines SSL1 to SSL4 and ground selection lines GSL1 and GSL2. Afterwards, as illustrated in FIG. 5, a turn-off voltage VOFF is applied to unselected string selection lines SSL2 to SSL4 and an unselected ground selection line GSL2.

Figure 10:
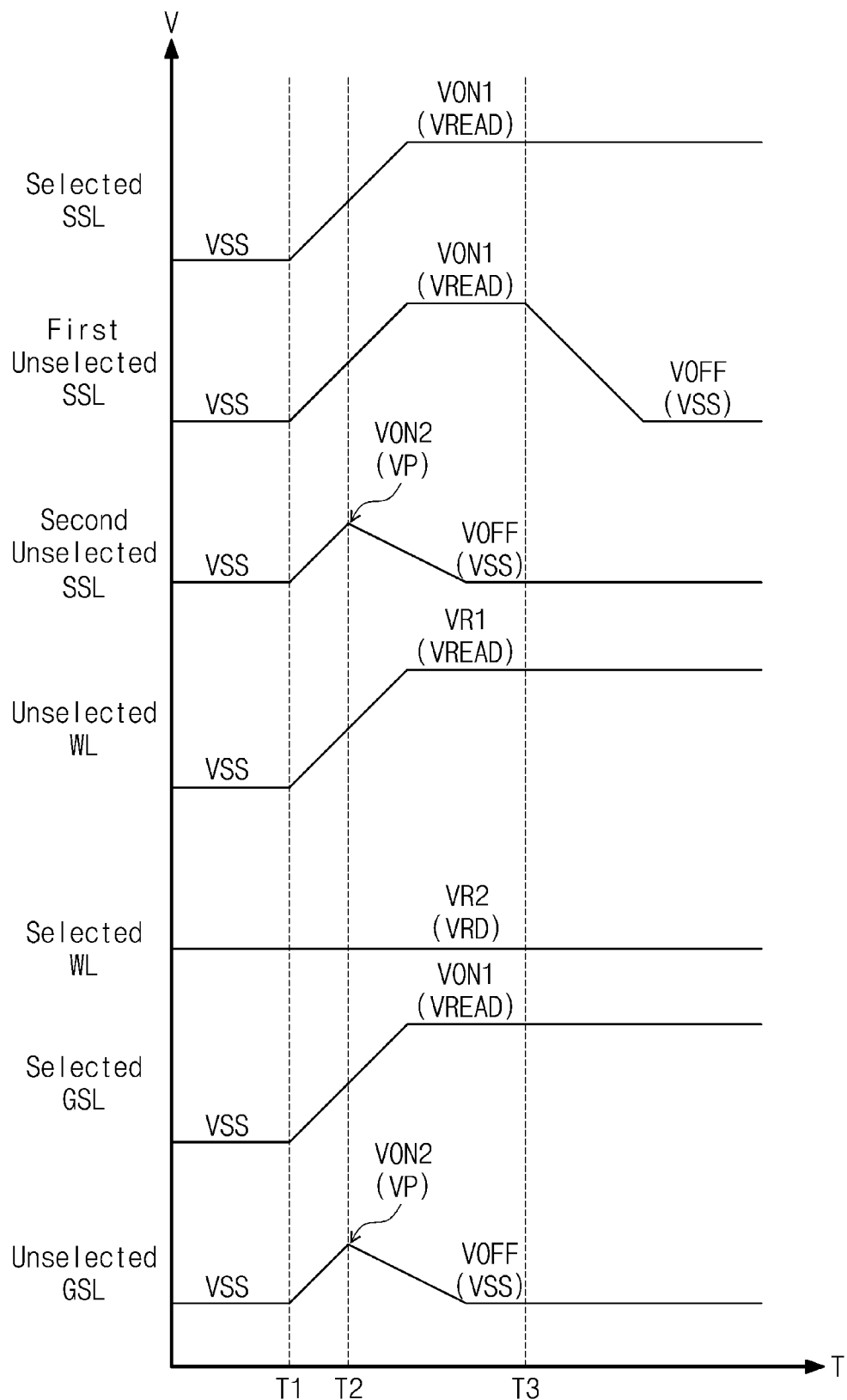
FIG. 10 is a timing diagram of an example read operation using the voltages illustrated in FIGS. 5 and 9.

FIG. 10 is a timing diagram of an example read operation using the voltages illustrated in FIGS. 5 and 9.

Referring to FIGS. 1 to 3, 5, 9 and 10, at time T1, first turn-on voltage VON1 is applied to a selected string selection line SSL1. First turn-on voltage VON1 is applied to a first unselected string selection line. First turn-on voltage VON1 is applied to second unselected string selection lines.

A first read voltage VR1 is applied to an unselected wordline, and a second read voltage VR2 is applied to a selected wordline. First turn-on voltage VON1 is applied to a selected ground selection line GSL1. Second turn-on voltage VON2 is applied to an unselected ground selection line GSL2.

At time T2, an additional operation is performed before voltages of the unselected ground selection line GSL2 and the second unselected string selection lines SSL3 and SSL4 reach a target level of first turn-on voltage VON1. At time T2, turn-off voltage VOFF is applied to the unselected ground selection line GSL2 and the second unselected string selection lines SSL3 and SSL4.

At time T3, an additional operation is performed before a voltage of the first unselected string selection line SSL2 reaches a target level of first turn-on voltage VON1. At time T3, turn-off voltage VOFF is applied to the first unselected string selection line SSL2.

That is, the same voltage is applied to string selection lines SSL1 to SSL4 and ground selection lines GSL1 and GSL2, and the turn-off voltage is applied before voltages of the unselected ground selection line GSL2 and the second unselected string selection lines SSL3 and SSL4 reach a target level. Thus, the same operation as that described with reference to FIGS. 4 to 6 may be performed.

FIG. 11 is a diagram of a third example of voltages that can be used in the method of FIG. 3. Compared to FIG. 4, a third turn-on voltage VON3 is applied to a selected wordline. The third turn-on voltage VON3 may be a positive voltage VP. The third turn-on voltage VON3 can be set to be lower than a read voltage VREAD. Afterwards, as illustrated in FIG. 5, turn-off voltage VOFF is applied to the selected wordline.

Figure 12:
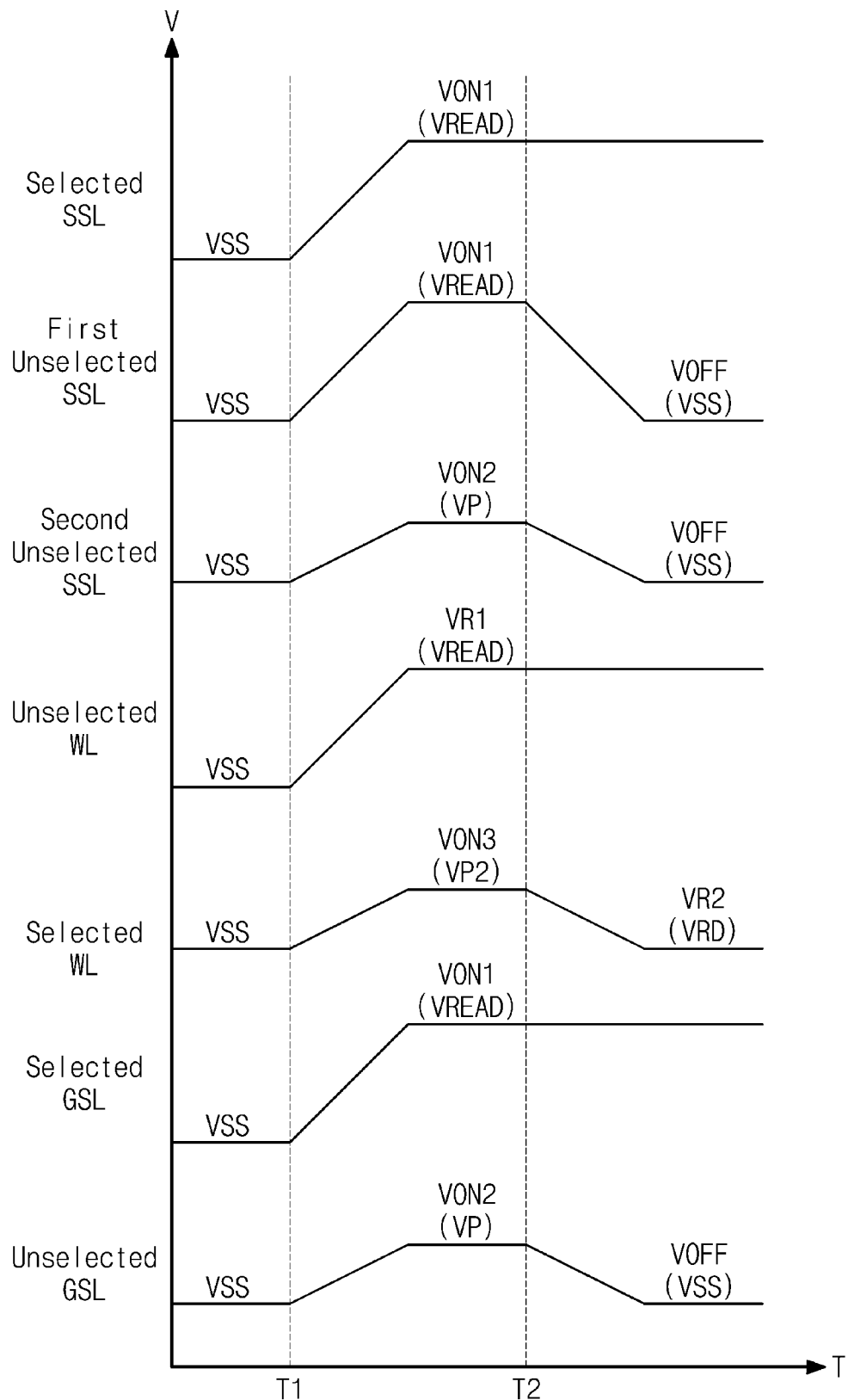
FIG. 12 is a timing diagram of an example read operation using the voltages illustrated in FIGS. 5 and 11.

FIG. 12 is a timing diagram of an example read operation using the voltages illustrated in FIGS. 5 and 11.

Referring to FIGS. 1 to 3, 5, 11 and 12, at time T1, first turn-on voltage VON1 is applied to a selected string selection line SSL1. First turn-on voltage VON1 is applied to a first unselected string selection line. First turn-on voltage VON1 is applied to a second unselected string selection lines.

A first read voltage VR1 is applied to an unselected wordline, and a third read voltage VR3 is applied to a selected wordline. First turn-on voltage VON1 is applied to a selected ground selection line GSL1. First turn-on voltage VON1 is applied to an unselected ground selection line GSL2.

At time T2, turn-off voltage VOFF is applied to a first unselected string selection line SSL2 and to second unselected string selection lines SSL3 and SSL4. The turn-off voltage VOFF is applied to an unselected ground selection line GSL2. A second read voltage VR2 is applied to a selected wordline.

In embodiments described with reference to FIGS. 5, 11 and 12, after the third turn-on voltage VON3 is applied to a selected wordline, second read voltage VR2 is applied. When the third turn-on voltage is applied, memory cells connected to the selected wordline may be turned on.

As described with reference to FIGS. 7 and 8, when second read voltage VR2 is applied to a selected wordline, memory cells connected to the selected wordline may be turned off. At this time, a string channel may be divided into two portions on the basis of the selected wordline.

According to an embodiment of the inventive concept, the third turn-on voltage VON3 is applied to a selected wordline, and then second read voltage VR2 is applied thereto. Thus, channel voltages of memory cells may be leveled before a string channel is divided into two portions by second read voltage VR2. Because channel voltages of memory cells in each cell string are leveled on the basis of a selected memory cell, the probability that hot electrons are generated at the selected memory cell may be suppressed. That is, read disturbance may be further prevented or reduced.

FIG. 13 is a diagram of a fourth example of voltages that can be used in the method of FIG. 3. Compared to FIG. 9, first turn-on voltage VON1 is applied to a selected wordline. The first turn-on voltage may be a read voltage VREAD. Afterwards, as illustrated in FIG. 5, a turn-off voltage is applied to the selected wordline.

Figure 14:
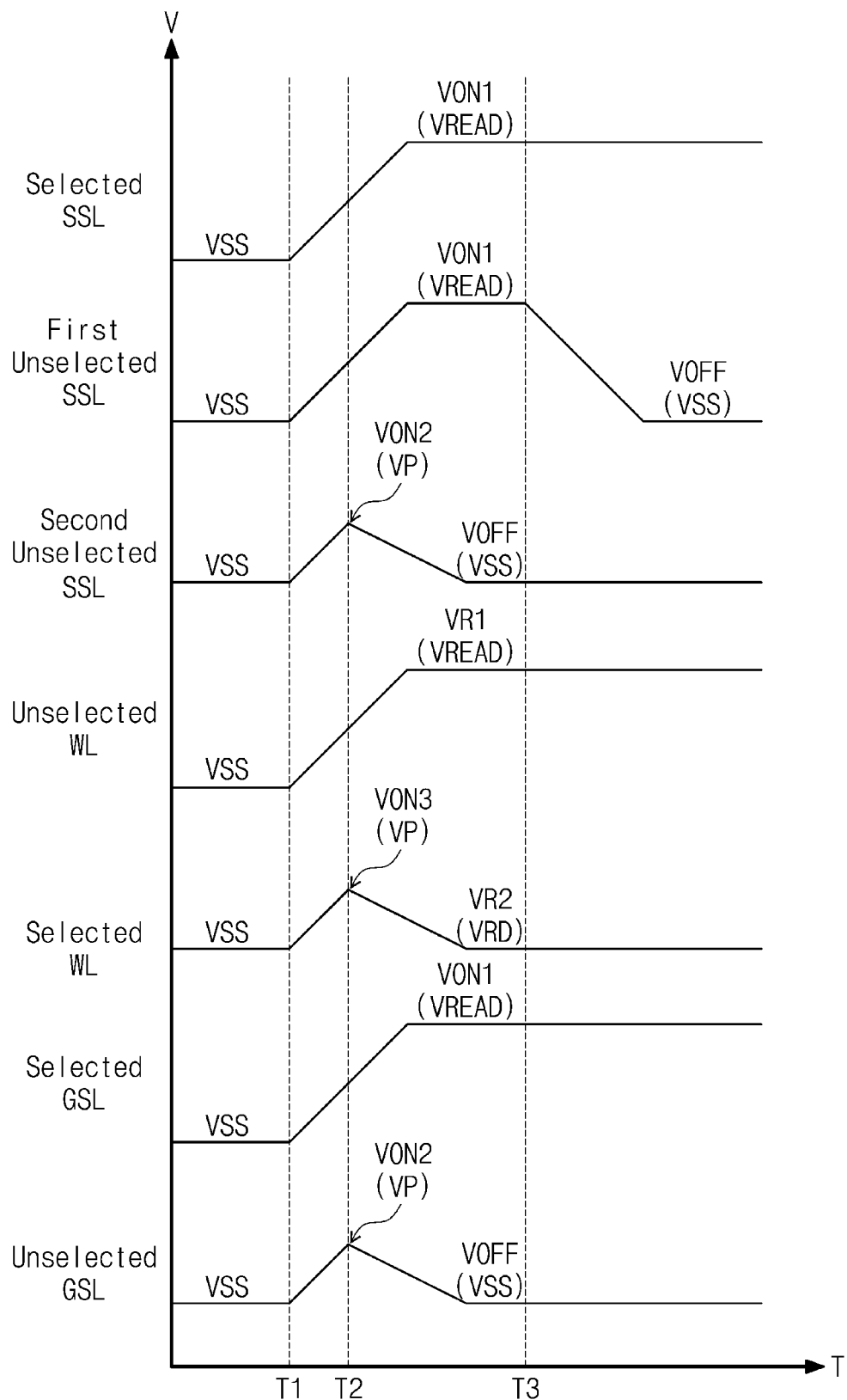
FIG. 14 is a timing diagram of an example read operation using the voltages illustrated in FIGS. 5 and 13.

FIG. 14 is a timing diagram of an example read operation using the voltages illustrated in FIGS. 5 and 13.

Referring to FIGS. 1 to 3, 5, 13 and 14, at time T1, first turn-on voltage VON1 is applied to a selected string selection line SSL1. First turn-on voltage VON1 is applied to a first unselected string selection line. First turn-on voltage VON1 is applied second unselected string selection lines.

A first read voltage VR1 is applied to an unselected wordline, and first turn-on voltage VON1 is applied to a selected wordline. First turn-on voltage VON1 is applied to a selected ground selection line GSL1. First turn-on voltage VON1 is applied to an unselected ground selection line GSL2.

At time T2, an additional operation may be performed before voltages of the unselected ground selection line GSL2 and second unselected string selection lines SSL3 and SSL4 reach a target level of first turn-on voltage VON1. At time T2, turn-off voltage VOFF is applied to the unselected ground selection line GSL2 and the second unselected string selection lines SSL3 and SSL4. A second read voltage VR2 is applied to the selected wordline.

At time T3, an additional operation may be performed before a voltage of the first unselected string selection line SSL2 reaches a target level of first turn-on voltage VON1. At time T3, turn-off voltage VOFF is applied to the first unselected string selection line SSL2.

FIG. 15 is a diagram of a fifth example of voltages that can be used in the method of FIG. 3. Compared to FIG. 4, second turn-on voltage VON2 is applied to all string selection lines SSL, unselected wordlines and all ground selection lines GSL. Afterwards, as illustrated in FIG. 5, first turn-on voltage VON1 is applied to a selected string selection line, a first read voltage VR1 is applied to the unselected wordlines, and turn-off voltage VOFF is applied to an unselected ground selection line GSL.

Figure 16:
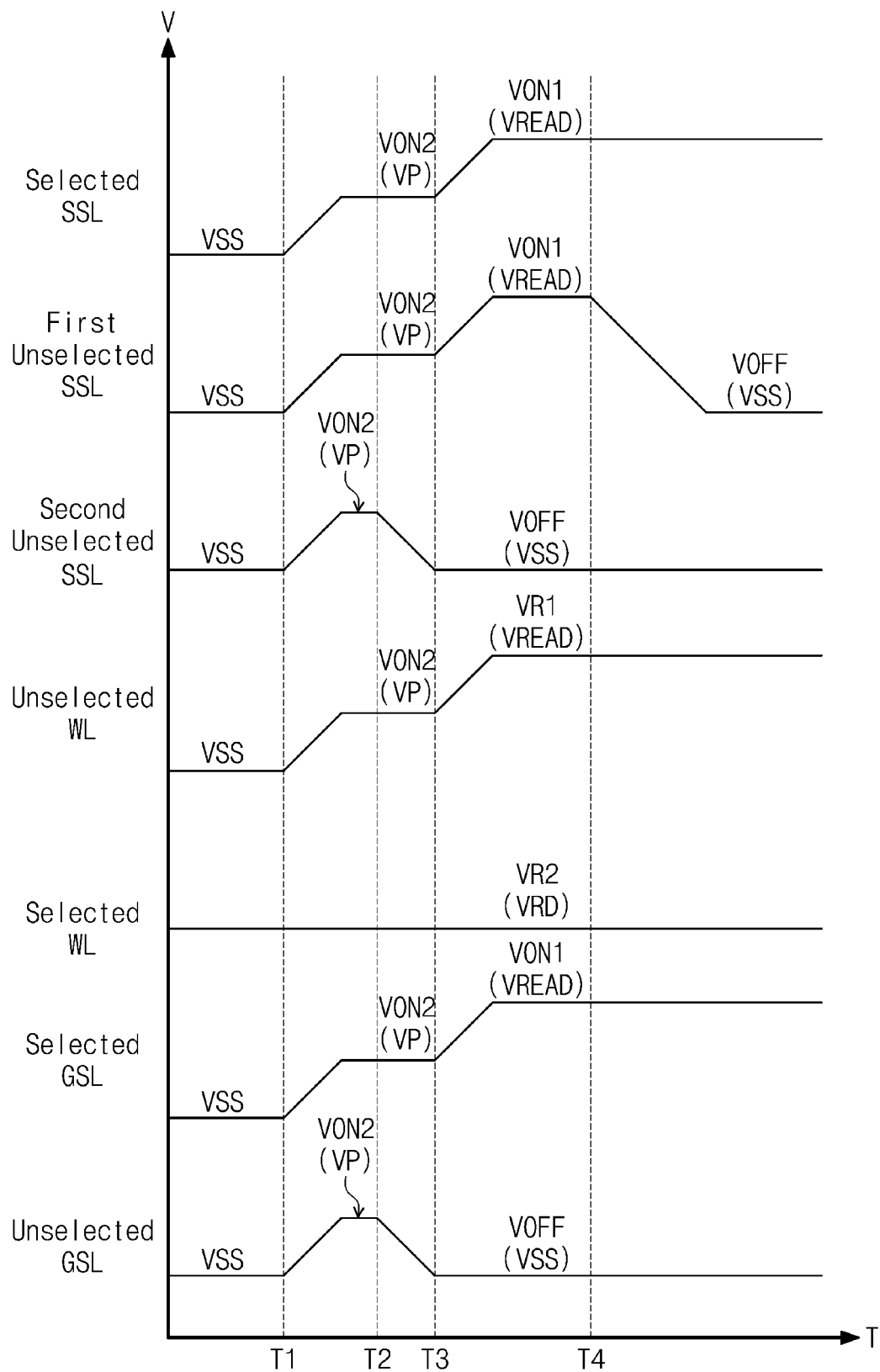
FIG. 16 is a timing diagram of an example read operation using the voltages illustrated in FIGS. 5 and 15.

FIG. 16 is a timing diagram of an example read operation using the voltages illustrated in FIGS. 5 and 15.

Referring to FIGS. 1 to 3, 5, 15 and 16, at time T1, second turn-on voltage VON2 is applied to a selected string selection line SSL1, a first unselected string selection line SSL2, a second unselected string selection line SSL3 or SSL4, unselected wordlines, a selected ground selection line GSL1, and an unselected ground selection line GSL2.

After voltages of the second unselected string selection line SSL3 or SSL4 and the unselected ground selection line GSL2 reach second turn-on voltage VON2, at time T2, turn-off voltage VOFF is applied to the second unselected string selection line SSL3 or SSL4 and the unselected ground selection line GSL2.

After the turn-off voltage VOFF is applied to the second unselected string selection line SSL3 or SSL4 and the unselected ground selection line GSL2, at time T3, first turn-on voltage VON1 is applied to the selected string selection line SSL1 and the first unselected string selection line SSL2. A first read voltage VR1 is applied to the unselected wordlines, and a second read voltage VR2 is applied to the selected wordline. First turn-on voltage VON1 is applied to the selected ground selection line GSL1, and the turn-off voltage VOFF is applied to the unselected ground selection line GSL2.

At time T4, an additional operation is performed after a voltage of the first unselected string selection line SSL2 reaches a target level of first turn-on voltage VON1. At time T4, the turn-off voltage VOFF is applied to the first unselected string selection line SSL2.

FIG. 17 is a diagram of a sixth example of voltages that can be used in the method of FIG. 3. Compared to FIG. 15, second turn-on voltage VON2 is applied to a selected wordline. Afterwards, as illustrated in FIG. 5, first turn-on voltage VON1 is applied to a selected string selection line, a first read voltage VR1 is applied to unselected wordlines, and a turn-off voltage is applied to an unselected ground selection line.

Figure 18:
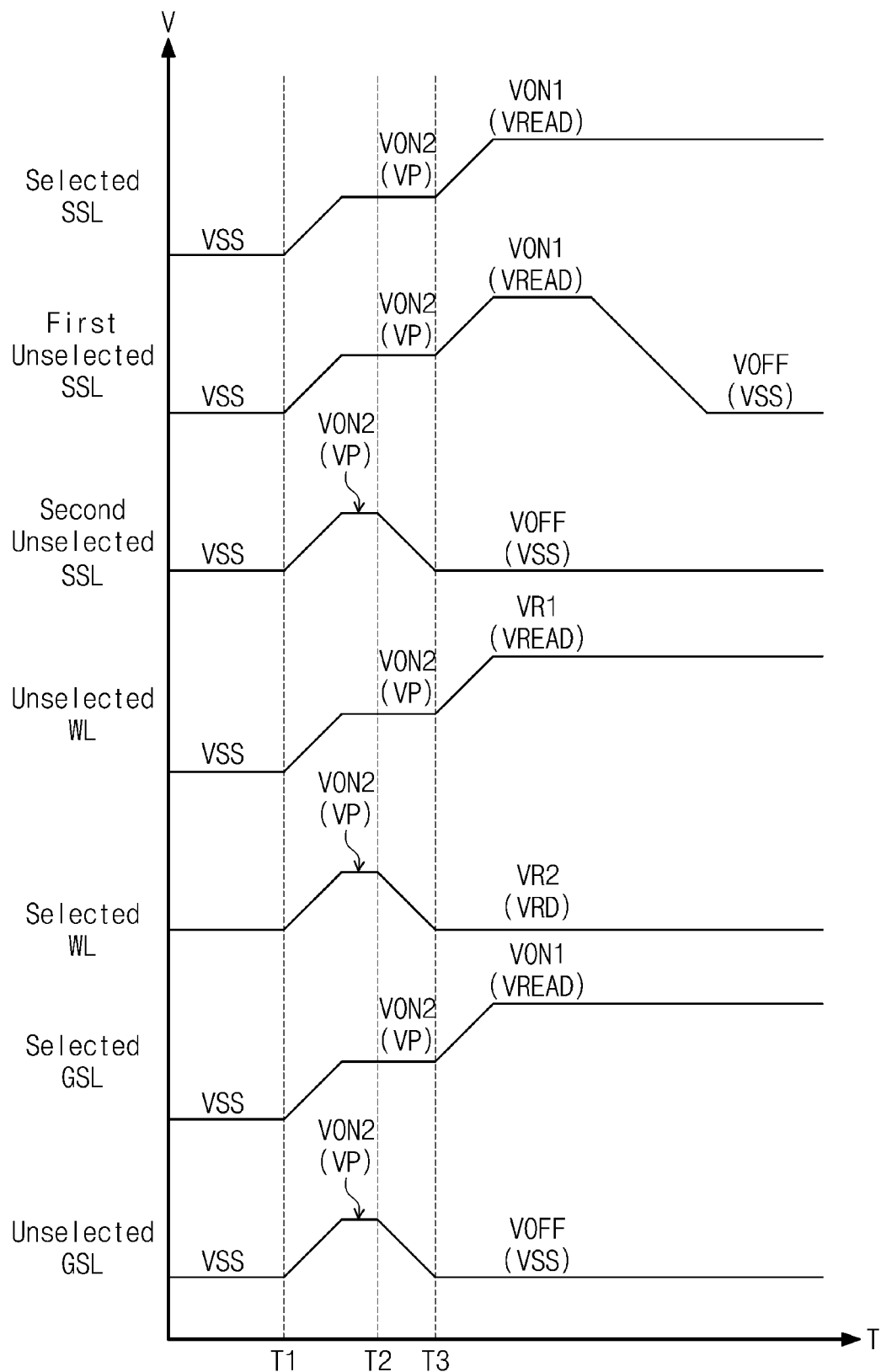
FIG. 18 is a timing diagram of an example read operation using the voltages illustrated in FIGS. 5 and 17.

FIG. 18 is a timing diagram of an example read operation using the voltages illustrated in FIGS. 5 and 17.

Referring to FIGS. 1 to 3, 5, 17 and 18, at time T1, second turn-on voltage VON2 is applied to a selected string selection line SSL1, a first unselected string selection line SSL2, a second unselected string selection line SSL3 or SSL4, a selected wordline, unselected wordlines, a selected ground selection line GSL1, and an unselected ground selection line GSL2.

After voltages of the second unselected string selection line SSL3 or SSL4, the selected wordline and the unselected ground selection line GSL2 reach second turn-on voltage VON2, at time T2, turn-off voltage VOFF is applied to the second unselected string selection line SSL3 or SSL4, the selected wordline and the unselected ground selection line GSL2.

After voltages of the second unselected string selection line SSL3 or SSL4 and the unselected ground selection line GSL2 reach turn-off voltage VOFF, at time T3, first turn-on voltage VON1 is applied to the selected string selection line SSL1 and the first unselected string selection line SSL2. A first read voltage VR1 is applied to the unselected wordlines and a second read voltage VR2 is applied to the selected wordline. First turn-on voltage VON1 is applied to the selected ground selection line GSL1, and the turn-off voltage VOFF is applied to the unselected ground selection line GSL2.

At time T4, an additional operation is performed after a voltage of the first unselected string selection line SSL2 reaches a target level of first turn-on voltage VON1. At time T4, the turn-off voltage VOFF is applied to the first unselected string selection line SSL2.

In example embodiments, voltage applying methods described with reference to FIGS. 6, 10, 12, 14, and 16 may be a preset operation executed at a read operation. The preset operation may be a preparation operation for performing a read operation on cell strings CS11 to CS41 and CS12 to CS42. After the preset operation is performed, a pre-charge voltage is applied to bitlines BL1 and BL2 and a read operation may be performed.

In the preset operation, voltages for turning on and off string or ground selection transistors may be pre-pulses. The pre-pulses are applied to prevent phenomenon causing an abnormal operation such as read disturbance.

Pre-pulses according to embodiments of the inventive concept may be variously mixed. For example, as described with reference to FIGS. 6, 12, 16, and 18, a part of pre-pulses may be set to be lower than voltages used at a read operation. As described with reference to FIGS. 10 and 14, a part of pre-pulses may be set to have shorter duration as compared to voltages used at a read operation. Various combinations of the lower level and the shorter duration may be made.

Figure 19:
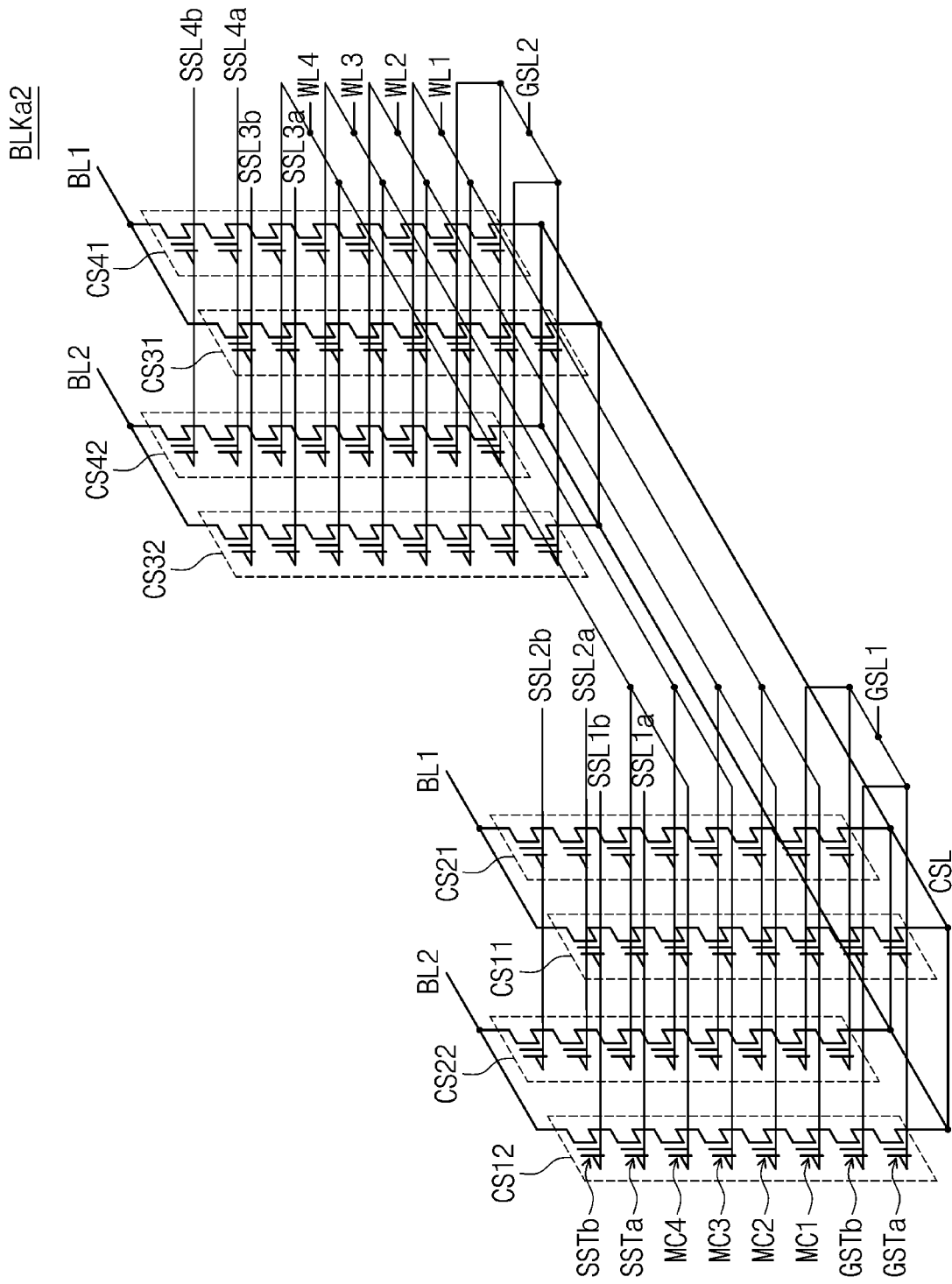
FIG. 19 is a circuit diagram of a memory block according to an embodiment of the inventive concept.

FIG. 19 is a circuit diagram of a memory block BLKb according to an embodiment of the inventive concept. Compared to a memory block BLKa of FIG. 2, a cell string comprises two string selection transistors SSTa and SSTb. In each cell string, string selection transistors SSTa and SSTb may be stacked in a direction perpendicular to a substrate.

In a first row of cell strings CS11 and CS12, string selection transistors SSTa are connected in common to a string selection line SSL1a, and string selection transistors SSTb are connected in common to a string selection line SSL1b. In a second row of cell strings CS21 and CS22, string selection transistors SSTa are connected in common to a string selection line SSL2a, and string selection transistors SSTb are connected in common to a string selection line SSL2b. In a third row of cell strings CS31 and CS32, string selection transistors SSTa are connected in common to a string selection line SSL3a, and string selection transistors SSTb are connected in common to a string selection line SSL3b. In a fourth row of cell strings CS41 and CS42, string selection transistors SSTa are connected in common to a string selection line SSL4a, and string selection transistors SSTb are connected in common to a string selection line SSL4b.

A cell string comprises two ground selection transistors GSTa and GSTb. In each cell string, ground selection transistors GSTa and GSTb may be stacked in a direction perpendicular to the substrate. In first and second rows of cell strings CS11, CS12, CS21, and CS22, ground selection transistors GSTa and GSTb are connected in common to a ground selection line GSL1. In third and fourth rows of cell strings CS31, CS32, CS41, and CS42, ground selection transistors GSTa and GSTb are connected in common to a ground selection line GSL2.

In some embodiments, in each cell string, connection between string selection transistors SSTa and SSTb and string selection lines and connection between ground selection transistors GSTa and GSTb and ground selection lines may be variously changed or modified. For example, like connection between ground selection transistors GSTa and GSTb and ground selection lines GSL1 and GSL2, string selection transistors SSTa and SSTb in a cell string may be connected in common. Alternatively, for example, like connection between string selection transistors SSTa and SSTb and string selection lines SSL1 to SSL4, string selection transistors SSTa and SSTb in a cell string may be connected in common to a string selection line.

Figure 20:
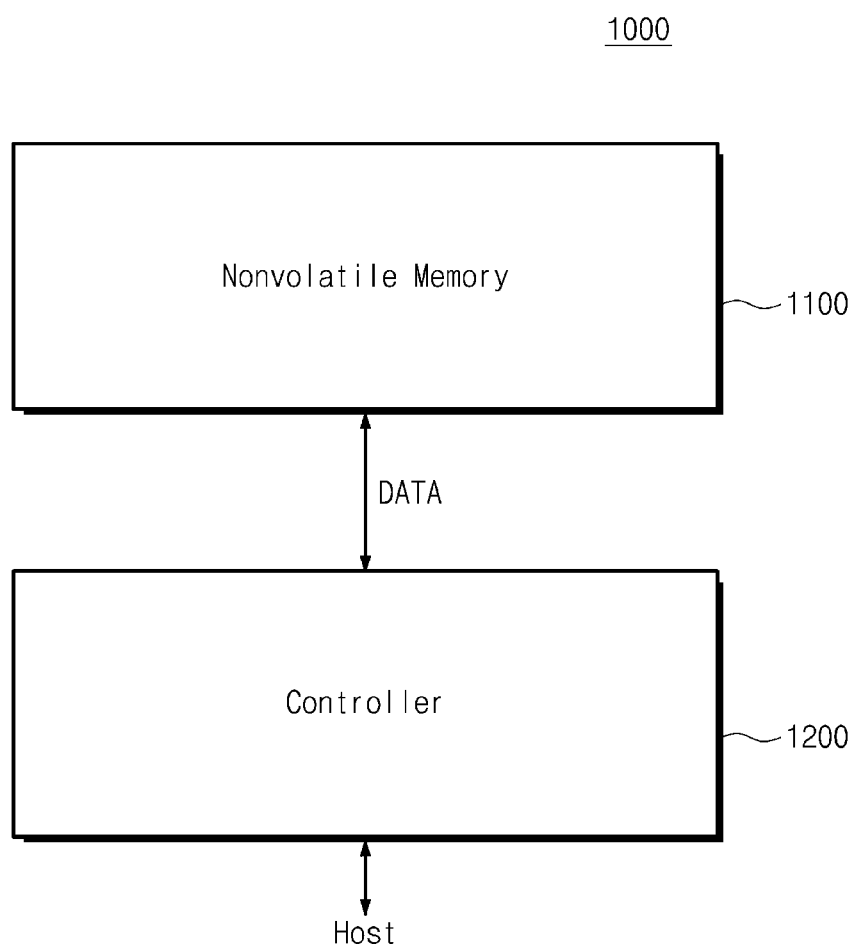
FIG. 20 is a block diagram of a memory system according to an embodiment of inventive concepts.

FIG. 20 is a block diagram of a memory system 1000 according to an embodiment of inventive concepts.

Referring to FIG. 20, memory system 1000 comprises a nonvolatile memory device 1100 and a controller 1200. Nonvolatile memory 1100 may be a nonvolatile memory 100 described with reference to FIGS. 1 to 19. Nonvolatile memory 1100 performs a preset operation for applying pre-pulses as described with reference to FIGS. 1 to 19. Nonvolatile memory 1100 may comprise at least one of nonvolatile memories such as an EEPROM, a flash memory, a PRAM, an RRAM, an FRAM, and so on.

Controller 1200 is connected to nonvolatile memory 1100 and is configured to access nonvolatile memory device 1100. For example, controller 1200 may be adapted to control overall operations of nonvolatile memory 1100 comprising a read operation, a write operation, an erase operation, a background operation, and so on. Controller 1200 provides an interface between nonvolatile memory 1100 and a host. Controller 1200 may be configured to drive firmware for controlling nonvolatile memory 1100.

In some embodiments, controller 1200 may comprise features such as a RAM, a processing unit, a host interface, a memory interface, and an error correction unit. Controller 1200 may communicate with an external device (e.g., a host) according to a particular communication protocol. For example, controller 1200 may communicate with the external device through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, and so on.

Controller 1200 and nonvolatile memory device 1100 may be integrated into a single semiconductor device. For example, controller 1200 and nonvolatile memory device 1100 may be integrated into a single semiconductor device to form a memory card such as a PC card (PCMCIA, personal computer memory card international association), a compact flash card (CF), a smart media card (SM, SMC), a memory stick, a multimedia card (MMC, RS-MMC, MMC-micro), an SD card (SD, miniSD, microSD, SDHC), a universal flash storage (UFS), and so on.

Controller 1200 and nonvolatile memory device 1100 may be integrated into a single semiconductor device to form an SSD. The SSD may comprise a storage unit configured to store data in a semiconductor memory. In the event that memory system 1000 is used as the SSD, the operating speed of the host connected to memory system 1000 may be improved.

As another example, memory system 1000 may be provided as one of various features of an electronic device such as a computer, a ultra-mobile personal computer (UMPC), a workstation, a net-book, a personal digital assistance (PDA), a portable computer (PC), a web tablet, a wireless phone, a mobile phone, a smart phone, a smart television, a 3D television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various features constituting a computing system.

Nonvolatile memory device 1100 or memory system 1000 may be packaged in various kinds of packages. For instance, nonvolatile memory device 1100 or memory system 1000 may be implemented with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 21:
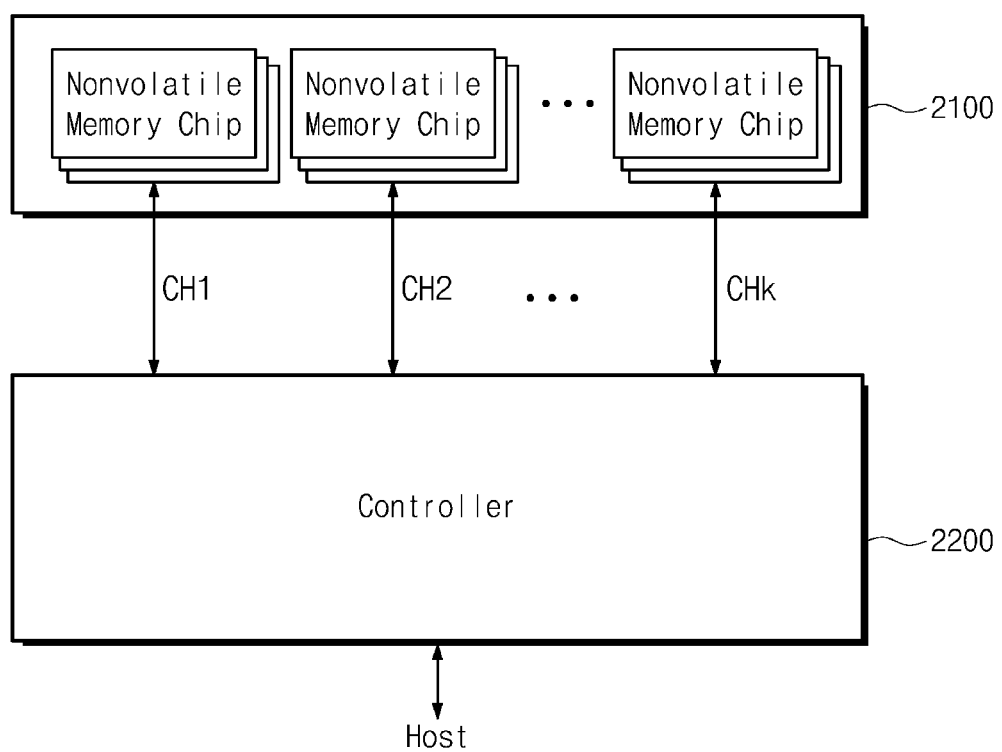
FIG. 21 is a block diagram of a memory system according to an embodiment of the inventive concept.

FIG. 21 is a block diagram of a memory system 2000 according to an embodiment of the inventive concept.

Referring to FIG. 21, memory system 2000 comprises a nonvolatile memory 2100 and a controller 2200. Nonvolatile memory 2100 comprises multiple nonvolatile memory chips, which form multiple groups. Nonvolatile memory chips in each group may be configured to communicate with controller 2200 via one common channel. In certain embodiments, the nonvolatile memory chips communicate with controller 2200 via multiple channels CH1 to CHk.

In some embodiments, each of the nonvolatile memory chips comprises a nonvolatile memory 100 described with reference to FIGS. 1 to 19. Each of the nonvolatile memory chips performs a preset operation for applying pre-pulses as described with reference to FIGS. 1 to 19. In the example of FIG. 21, one channel is connected to multiple nonvolatile memory chips. However, memory system 2000 can be modified such that one channel is connected to one nonvolatile memory chip.

Figure 22:
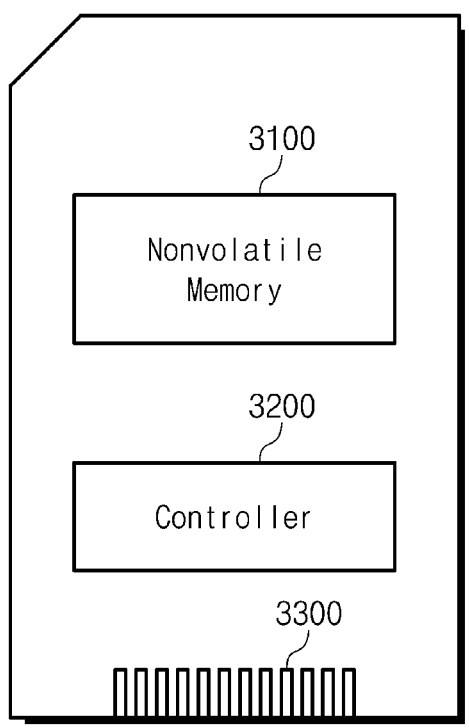
FIG. 22 is a diagram of a memory card according to an embodiment of the inventive concept.

FIG. 22 is a diagram of a memory card 3000 according to an embodiment of the inventive concept.

Referring to FIG. 22, memory card 3000 comprises a nonvolatile memory 3100, a controller 3200, and a connector 3300. Nonvolatile memory 3100 may be a nonvolatile memory 100 described with reference to FIGS. 1 to 19. Nonvolatile memory 3100 may perform a preset operation for applying pre-pulses as described with reference to FIGS. 1 to 19. Connector 3300 may electrically connect memory card 3000 with a host.

Memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 23:
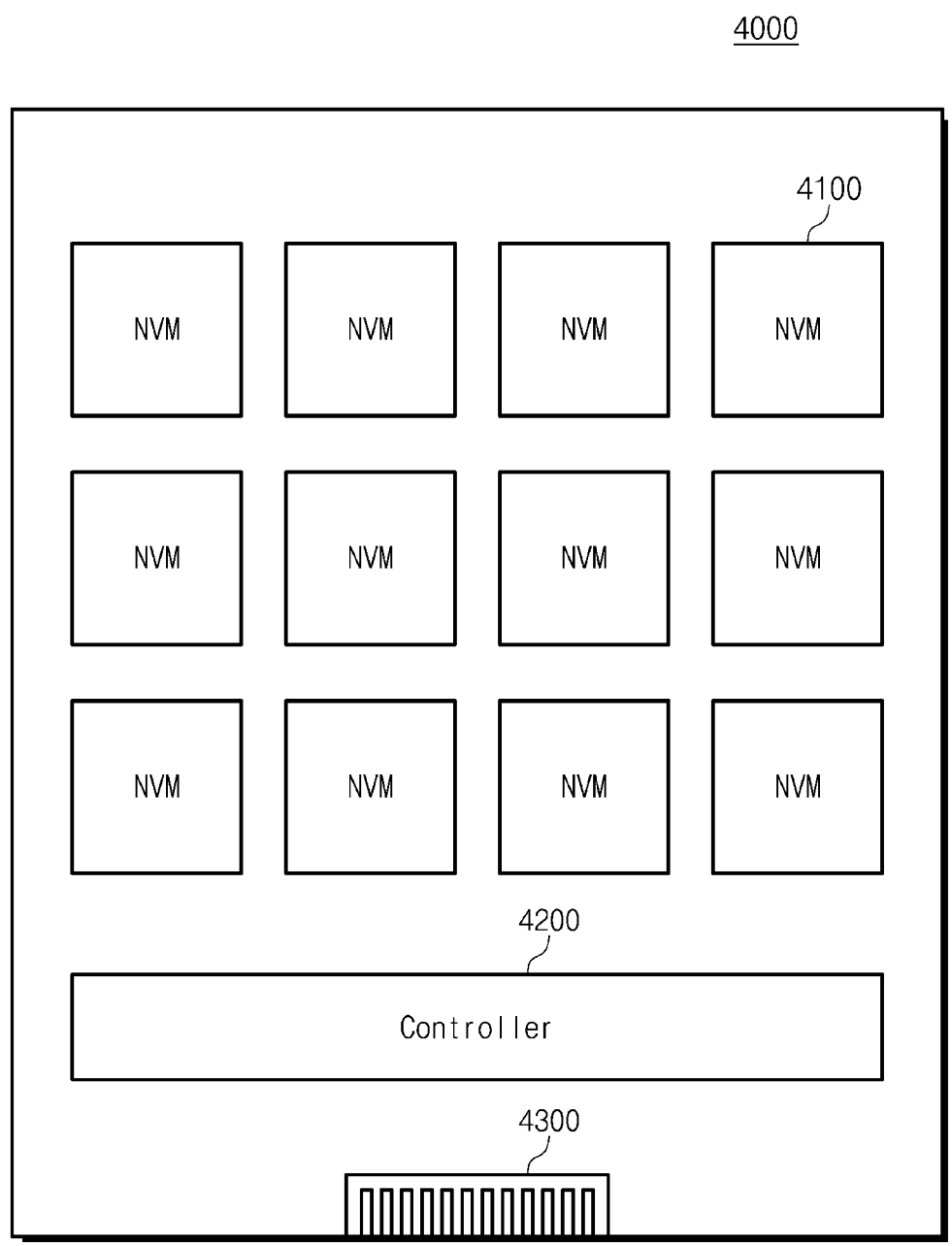
FIG. 23 is a diagram of a solid state drive (SSD) according to an embodiment of the inventive concept.

FIG. 23 is a diagram of an SSD 4000 according to an embodiment of the inventive concept.

Referring to FIG. 23, SSD 4000 comprises multiple nonvolatile memories 4100, a controller 4200, and a connector 4300. Nonvolatile memory 4100 may be a nonvolatile memory 100 described with reference to FIGS. 1 to 19. Nonvolatile memory 4100 may perform a preset operation for applying pre-pulses as described with reference to FIGS. 1 to 19. Connector 4300 may connect solid state driver 4000 with a host electrically.

Figure 24:
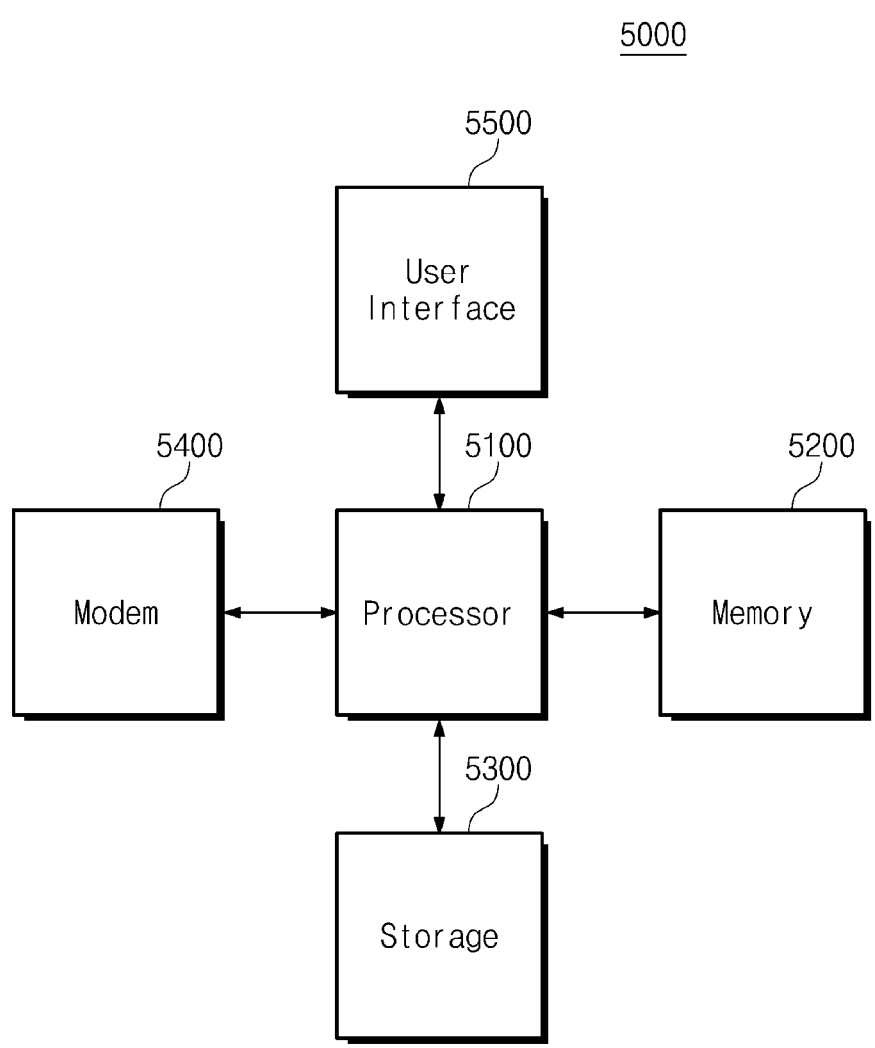
FIG. 24 is a block diagram of a computing device according to an embodiment of the inventive concept.

FIG. 24 is a block diagram of a computing device 5000 according to an embodiment of the inventive concept.

Referring to FIG. 24, computing device 5000 comprises a processor 5100, a memory 5200, storage 5300, a modem 5400, and a user interface 5500.

Processor 5100 controls operations of computing device 5000, and it also performs logical operations. Processor 5100 may be formed of a system-on-chip (SoC). Processor 5100 may be a general purpose processor or an application processor.

Memory 5200 communicates with processor 5100. Memory 5200 may be a working memory (or, a main memory) of processor 5100 or computing device 5000. Memory 5200 may comprise a volatile memory such as a static RAM, a dynamic RAM, a synchronous DRAM, or the like or a nonvolatile memory such as a flash memory, a PRAM, an MRAM, an RRAM, an FRAM, or the like.

Storage 5300 may be used as a working memory or a long term storage memory of computing system 5000. Storage 300 may comprise a hard disk drive or a nonvolatile memory such as a flash memory, MRAM, RRAM, an FRAM, PRAM, or the like.

Storage 5300 may be a nonvolatile memory 100 described with reference to FIGS. 1 to 19. Storage 5300 may perform a preset operation for applying pre-pulses as described with reference to FIGS. 1 to 19.

In various alternative embodiments, memory 5200 and storage 5300 may be formed of a nonvolatile memory of a same type. In this case, memory 5200 and storage 5300 may be integrated into a semiconductor integrated circuit.

Modem 5400 communicates with an external device under control of processor 5100. For example, modem 5400 may communicate with the external device in a wire or wireless manner Modem 5400 typically communicates based on at least one of wireless communications manners such as Long Term Evolution (LTE), WiMax, Global System for Mobile communication (GSM), Code Division Multiple Access (CDMA), Bluetooth, Near Field Communication (NFC), WiFi, Radio Frequency Identification (RFID), and so on or wire communications manners such as Universal Serial Bus (USB), Serial AT Attachment (SATA), Small Computer Small Interface (SCSI), Firewire, Peripheral Component Interconnection (PCI), and so on.

User interface 5500 may communicate with a user under control of processor 5100. For example, user interface 5500 may comprise user input interfaces such as a keyboard, a keypad, a button, a touch panel, a touch screen, a touch pad, a touch ball, a camera, a microphone, a gyroscope sensor, a vibration sensor, and so on. User interface 5500 may further comprise user output interfaces such as an LCD, an OLED (Organic Light Emitting Diode) display device, an AMO-LED (Active Matrix OLED) display device, an LED, a speaker, a motor, and so on.

Figure 25:
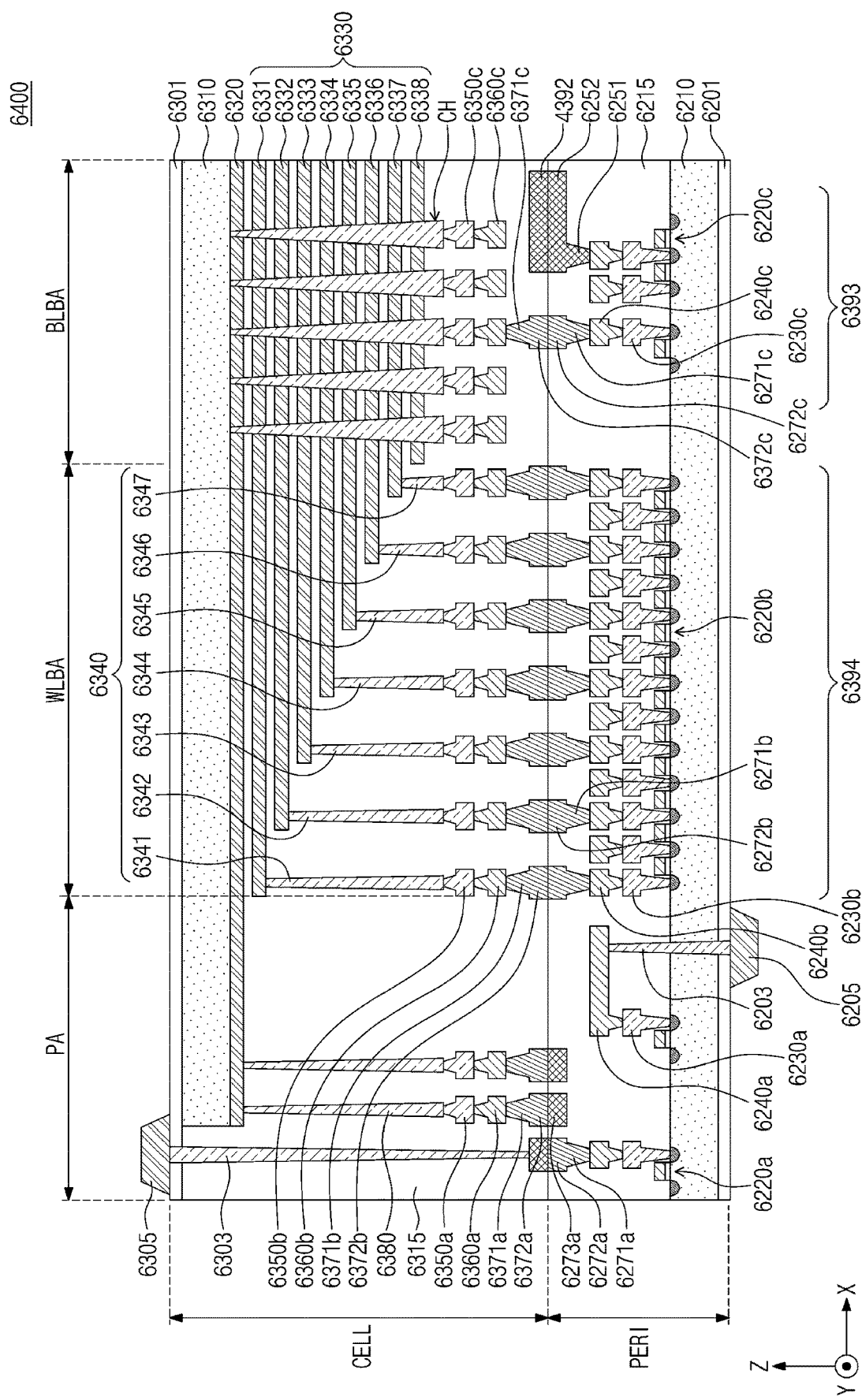
FIG. 25 is a diagram illustrating a memory device according to another example embodiment.

FIG. 25 is a diagram illustrating a memory device 6400 according to another example embodiment.

Referring to FIG. 25, a memory device 6400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu—Cu bonding. The example embodiment, however, may not be limited thereto. For example, the bonding metals may also be formed of aluminum (Al) or tungsten (W).

Each of the peripheral circuit region PERI and the cell region CELL of the memory device 6400 may include an external pad bonding area PA, a word line bonding area WLBA, and a bit line bonding area BLBA.

The peripheral circuit region PERI may include a first substrate 6210, an interlayer insulating layer 6215, a plurality of circuit elements 6220a, 6220b, and 6220c formed on the first substrate 6210, first metal layers 6230a, 6230b, and 6230c respectively connected to the plurality of circuit elements 6220a, 6220b, and 6220c, and second metal layers 6240a, 6240b, and 6240c formed on the first metal layers 6230a, 6230b, and 6230c. In an example embodiment, the first metal layers 6230a, 6230b, and 6230c may be formed of tungsten having relatively high electrical resistivity, and the second metal layers 6240a, 6240b, and 6240c may be formed of copper having relatively low electrical resistivity.

In an example embodiment illustrate in FIG. 25, although only the first metal layers 6230a, 6230b, and 6230c and the second metal layers 6240a, 6240b, and 6240c are shown and described, the example embodiment is not limited thereto, and one or more additional metal layers may be further formed on the second metal layers 6240a, 6240b, and 6240c. At least a portion of the one or more additional metal layers formed on the second metal layers 6240a, 6240b, and 6240c may be formed of aluminum or the like having a lower electrical resistivity than those of copper forming the second metal layers 6240a, 6240b, and 6240c.

The interlayer insulating layer 6215 may be disposed on the first substrate 6210 and cover the plurality of circuit elements 6220a, 6220b, and 6220c, the first metal layers 6230a, 6230b, and 6230c, and the second metal layers 6240a, 6240b, and 6240c. The interlayer insulating layer 6215 may include an insulating material such as silicon oxide, silicon nitride, or the like.

Lower bonding metals 6271b and 6272b may be formed on the second metal layer 6240b in the word line bonding area WLBA. In the word line bonding area WLBA, the lower bonding metals 6271b and 6272b in the peripheral circuit region PERI may be electrically bonded to upper bonding metals 6371b and 6372b of the cell region CELL. The lower bonding metals 6271b and 6272b and the upper bonding metals 6371b and 6372b may be formed of aluminum, copper, tungsten, or the like. Further, the upper bonding metals 6371b and 6372b in the cell region CELL may be referred as first metal pads and the lower bonding metals 6271b and 6272b in the peripheral circuit region PERI may be referred as second metal pads.

Further, the upper bonding metals 6371b and 6372b in the cell region CELL may be referred as first metal pads and the lower bonding metals 6271b and 6272b in the peripheral circuit region PERI may be referred as second metal pads.

The cell region CELL may include at least one memory block. The cell region CELL may include a second substrate 6310, an interlayer insulating layer 6315 and a common source line 6320. On the second substrate 6310, a plurality of word lines 6331 to 6338 (i.e., 6330) may be stacked in a direction (a Z-axis direction), perpendicular to an upper surface of the second substrate 6310. At least one string select line and at least one ground select line may be arranged on and below the plurality of word lines 6330, respectively, and the plurality of word lines 6330 may be disposed between the at least one string select line and the at least one ground select line.

Widths of the plurality of word lines 6330 along the X-direction may be different each other. As a distance from the first substrate 6210 of the peripheral circuit region PERI to respective one of the plurality of word line 6330 increases, the width of the respective one of the plurality of word line 6330 decreases. Similarly, as a distance from the second substrate 6310 of the cell region CELL to respective one of the plurality of word line 6330 increases, the width of the respective one of the plurality of word line 6330 increases.

In the bit line bonding area BLBA, a channel structure CH may extend in a direction (a Z-axis direction), perpendicular to the upper surface of the second substrate 6310, and pass through the plurality of word lines 6330, the at least one string select line, and the at least one ground select line. The channel structure CH may include a data storage layer, a channel layer, a buried insulating layer, and the like, and the channel layer may be electrically connected to a first metal layer 6350c and a second metal layer 6360c. For example, the first metal layer 6350c may be a bit line contact, and the second metal layer 6360c may be a bit line. In an example embodiment, the bit line 6360c may extend in a first direction (a Y-axis direction), parallel to the upper surface of the second substrate 6310.

The interlayer insulating layer 6315 may be disposed on the second substrate 6310 and cover the common source line 6320, the plurality of word lines 6330, the plurality of cell contact plugs 6340, the first metal layer 6350a, 6350b and 6350c, and the second metal layer 6360a, 6360b and 6360b. The interlayer insulating layer 6315 may include an insulating material such as silicon oxide, silicon nitride, or the like.

In an example embodiment illustrated in FIG. 25, an area in which the channel structure CH, the bit line 6360c, and the like are disposed may be defined as the bit line bonding area BLBA. In the bit line bonding area BLBA, the bit line 6360c may be electrically connected to the circuit elements 6220c providing a page buffer 6393 in the peripheral circuit region PERI. The bit line 6360c may be connected to upper bonding metals 6371c and 6372c in the cell region CELL, and the upper bonding metals 6371c and 6372c may be connected to lower bonding metals 6271c and 6272c connected to the circuit elements 6220c of the page buffer 6393.

In the word line bonding area WLBA, the plurality of word lines 6330 may extend in a second direction (an X-axis direction), parallel to the upper surface of the second substrate 6310 and perpendicular to the first direction, and may be connected to a plurality of cell contact plugs 6341 to 6347 (i.e., 6340). The plurality of word lines 6330 and the plurality of cell contact plugs 6340 may be connected to each other in pads provided by at least a portion of the plurality of word lines 6330 extending in different lengths in the second direction. A first metal layer 6350*b* and a second metal layer 6360*b* may be connected to an upper portion of the plurality of cell contact plugs 6340 connected to the plurality of word lines 6330, sequentially. The plurality of cell contact plugs 6340 may be connected to the peripheral circuit region PERI by the upper bonding metals 6371*b* and 6372*b* of the cell region CELL and the lower bonding metals 6271*b* and 6272*b* of the peripheral circuit region PERI in the word line bonding area WLBA.

The plurality of cell contact plugs 6340 may be electrically connected to the circuit elements 6220*b* forming a row decoder 6394 in the peripheral circuit region PERI. In an example embodiment, operating voltages of the circuit elements 6220*b* of the row decoder 6394 may be different than operating voltages of the circuit elements 6220*c* forming the page buffer 6393. For example, operating voltages of the circuit elements 6220*c* forming the page buffer 6393 may be greater than operating voltages of the circuit elements 6220*b* forming the row decoder 6394.

A common source line contact plug 6380 may be disposed in the external pad bonding area PA. The common source line contact plug 6380 may be formed of a conductive material such as a metal, a metal compound, polysilicon, or the like, and may be electrically connected to the common source line 6320. A first metal layer 6350*a* and a second metal layer 6360*a* may be stacked on an upper portion of the common source line contact plug 6380, sequentially. For example, an area in which the common source line contact plug 6380, the first metal layer 6350*a*, and the second metal layer 6360*a* are disposed may be defined as the external pad bonding area PA.

Input-output pads 6205 and 6305 may be disposed in the external pad bonding area PA. Referring to FIG. 25, a lower insulating film 6201 covering a lower surface of the first substrate 6210 may be formed below the first substrate 6210, and a first input-output pad 6205 may be formed on the lower insulating film 6201. The first input-output pad 6205 may be connected to at least one of the plurality of circuit elements 6220*a*, 6220*b*, and 6220*c* disposed in the peripheral circuit region PERI through a first input-output contact plug 6203, and may be separated from the first substrate 6210 by the lower insulating film 6201. In addition, a side insulating film may be disposed between the first input-output contact plug 6203 and the first substrate 6210 to electrically separate the first input-output contact plug 6203 and the first substrate 6210.

Referring to FIG. 25, an upper insulating film 6301 covering the upper surface of the second substrate 6310 may be formed on the second substrate 6310, and a second input-output pad 6305 may be disposed on the upper insulating layer 6301. The second input-output pad 6305 may be connected to at least one of the plurality of circuit elements 6220*a*, 6220*b*, and 6220*c* disposed in the peripheral circuit region PERI through a second input-output contact plug 6303. In the example embodiment, the second input-output pad 6305 is electrically connected to a circuit element 6220*a*.

According to embodiments, the second substrate 6310 and the common source line 6320 may not be disposed in an area in which the second input-output contact plug 6303 is disposed. Also, the second input-output pad 6305 may not overlap the word lines 6330 in the third direction (the Z-axis direction). Referring to FIG. 25, the second input-output contact plug 6303 may be separated from the second substrate 6310 in a direction, parallel to the upper surface of the second substrate 6310, and may pass through the interlayer insulating layer 6315 of the cell region CELL to be connected to the second input-output pad 6305 and the lower bonding metals 6271*a* and 6272*a* of the peripheral circuit area PERI.

According to embodiments, the first input-output pad 6205 and the second input-output pad 6305 may be selectively formed. For example, the memory device 6400 may include only the first input-output pad 6205 disposed on the first substrate 6210 or the second input-output pad 6305 disposed on the second substrate 6310. Alternatively, the memory device 6400 may include both the first input-output pad 6205 and the second input-output pad 6305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 6400 may include a lower metal pattern 6273*a*, corresponding to an upper metal pattern 6372*a* formed in an uppermost metal layer of the cell region CELL, and having the same cross-sectional shape as the upper metal pattern 6372*a* of the cell region CELL so as to be connected to each other, in an uppermost metal layer of the peripheral circuit region PERI. In the peripheral circuit region PERI, the lower metal pattern 6273*a* formed in the uppermost metal layer of the peripheral circuit region PERI may not be connected to a contact. Similarly, in the external pad bonding area PA, an upper metal pattern 6372*a*, corresponding to the lower metal pattern 6273*a* formed in an uppermost metal layer of the peripheral circuit region PERI, and having the same shape as a lower metal pattern 6273*a* of the peripheral circuit region PERI, may be formed in an uppermost metal layer of the cell region CELL.

The lower bonding metals 6271*b* and 6272*b* may be formed on the second metal layer 6240*b* in the word line bonding area WLBA. In the word line bonding area WLBA, the lower bonding metals 6271*b* and 6272*b* of the peripheral circuit region PERI may be electrically connected to the upper bonding metals 6371*b* and 6372*b* of the cell region CELL by a Cu-to-Cu bonding.

Further, in the bit line bonding area BLBA, an upper metal pattern 6392, corresponding to a lower metal pattern 6252 formed in the uppermost metal layer of the peripheral circuit region PERI, and having the same cross-sectional shape as the lower metal pattern 6252 of the peripheral circuit region PERI, may be formed in an uppermost metal layer of the cell region CELL. A contact may not be formed on the upper metal pattern 6392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in another one of the cell region CELL and the peripheral circuit region PERI. A contact may not be formed on the reinforcement metal pattern.

The cell region CELL may comprise the memory cell array 110 of FIG. 1. The peripheral circuit region PERI may comprise the address decoder 120, the read and write circuit 130, and the control logic and voltage generator 140 of FIG. 1.

As explained above referring to FIGS. 1 to 19, each ground selection line GSL may correspond to at least two string selection lines SSL. Each ground selection line GSL may be connected to cell strings which are connected to at least two string selection lines SSL. Cell strings of each memory block may be connected to at least two ground selection lines GSL.

Reading data from memory cells of a selected memory block may comprise a preset operation and a read operation. In an embodiment, the preset operation may comprise applying a turn-on voltage to selected ground selection line and selected and unselected string selection lines connected to cell strings connected to the selected ground selection line, and applying turn-off voltage to unselected ground selection line and unselected string selection line connected to cell strings connected to the unselected ground selection line. Voltage(s) applied to the string selection lines corresponding to the selected ground selection line may be different each other or the same. Voltage(s) applied to the string selection lines corresponding to the unselected ground selection line may be different each other or the same. The turn-on voltage(s) applied to the selected ground selection line and the selected and unselected string selection lines corresponding to the selected ground selection line may be a pre-pulse (s).

In another embodiment, the preset operation, the preset operation may comprises applying a turn-on voltage to selected and unselected string selection lines SSL and selected and unselected ground selection lines GSL to turn-on selected and unselected string selection transistors SST and selected and unselected ground selection transistors. Voltages applied to the selected and unselected string selection lines SSL may be different each other or the same. Voltages applied to the selected and unselected ground selection lines GSL may be different each other or the same. Voltages applied to the selected string selection line and an unselected string selection line corresponding to the selected ground selection line GSL may be different each other or the same. The turn-on voltage(s) applied to the string selection lines SSL and ground selection lines GSL may be a pre-pulse(s).

The preset operation may further comprise applying turn-on voltage to unselected word lines. The preset operation may further comprise applying a read voltage VRD to a selected word line. The preset operation may further comprise precharging bit lines BL with a positive voltage(s). The preset operation may further comprise biasing a common source line CSL with a voltage lower than the positive voltage of the bit lines BL. The voltage applied to the common source line CSL may be a ground voltage, a positive voltage or a negative voltage.

The read operation may comprise applying turn-on voltage to a selected string selection line and a selected ground selection line, and applying turn-off voltage to unselected string selection lines and an unselected ground selection line. The applying the turn-on voltage to the selected string selection line SSL and the selected ground selection line may be a continuation of applying the turn-on voltage of the preset operation.

The read operation may further comprise applying turn-on voltage to unselected word lines and a read voltage VRD to a selected word line. The applying the turn-on voltage to the unselected word lines and the read voltage VRD to the selected word line may be a continuation of the applying the turn-on voltage to the unselected word lines and the applying the read voltage VRD to the selected word line of the preset operation.

Figure 26:
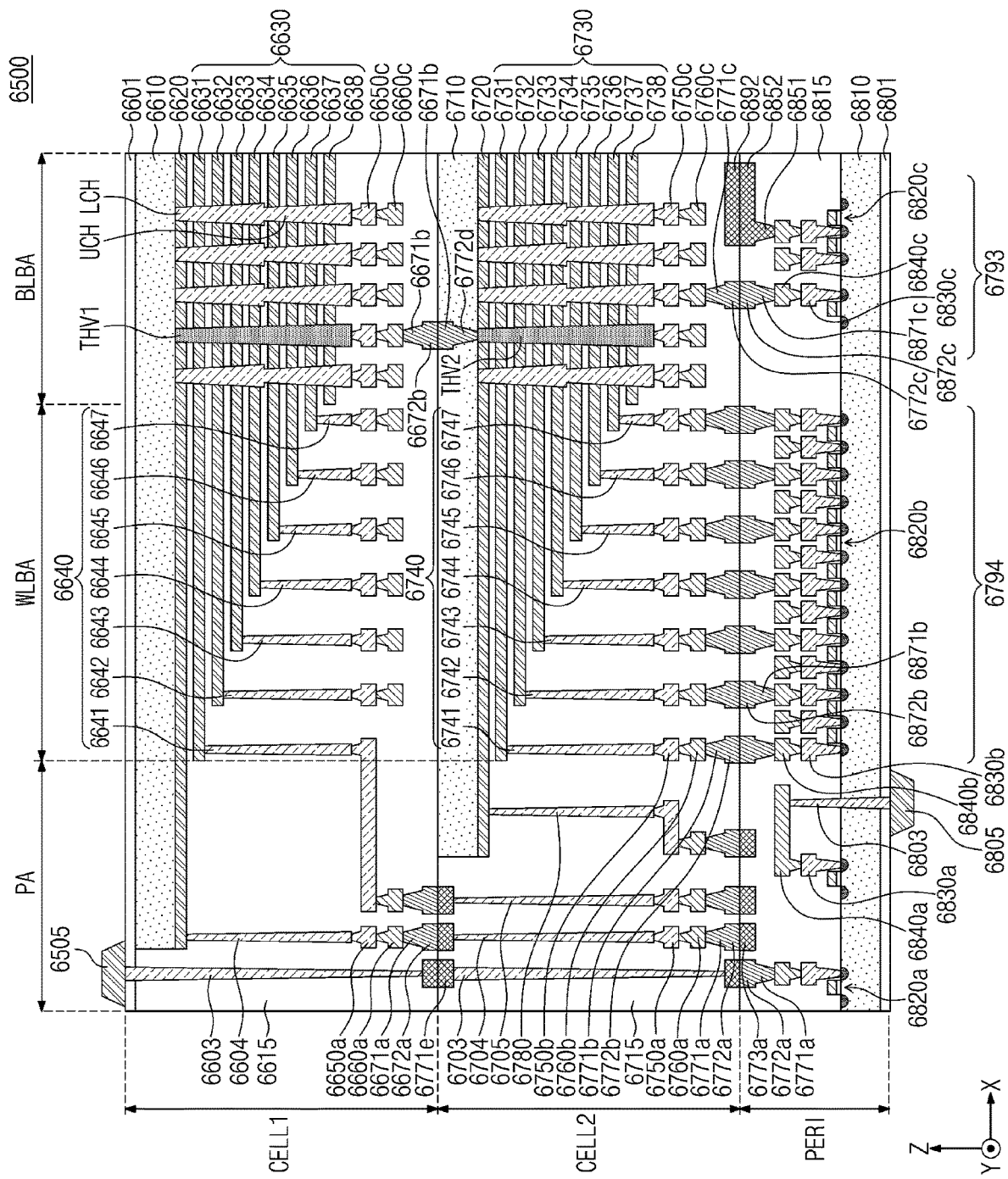
FIG. 26 illustrates a memory device having a chip-to-chip structure, according to exemplary embodiments of the inventive concepts.

FIG. 26 illustrates a memory device having a chip-to-chip (C2C) structure, according to exemplary embodiments of the inventive concepts.

Referring to FIG. 26, unlike the memory device 6400 of FIG. 25, the memory device 6500 may include two or more upper chips, each including a cell region. For example, the memory device 6500 may include a first upper chip including a first cell region CELL1, a second upper chip including a second cell region CELL2, and a lower chip including a peripheral circuit region PERI. The first upper chip, the second upper chip and the lower chip may be connected by a bonding method. However, the number of upper chips is not limited to thereto. Hereinafter, the above-described description through FIG. 25 may be omitted. Hereinafter, the cell region CELL may refer to at least one of the first cell region CELL1 and the second cell region CELL2.

The cell region CELL may include a lower channel LCH and an upper channel UCH connected to each other in the bit lie bonding area BLBA. The lower channel LCH and the upper channel UCH may form one channel structure. Unlike the channel structure CH of FIG. 25, the channel structure CH of FIG. 26 may be formed through a process for the lower channel LCH and a process for the upper channel UCH. In the first cell area CELL, the lower channel LCH extends in a direction perpendicular to the upper surface of the third substrate 6610 to penetrate the common source line 6620 and lower word lines 6631 to 6634. The lower channel LCH may include a data storage layer, a channel layer and a buried insulating layer, and may be connected to the upper channel UCH. The upper channel UCH may penetrate the upper word lines 6635 to 6638. The upper channel UCH may include a data storage layer, a channel layer and a buried insulating layer, and the channel layer of the upper channel UCH may be electrically connected to the first metal layer 6650c and the second metal layer 6660c. As the length of the channel increases, it may be difficult to form the channel having a constant width for process reasons. The memory device 6500 according to an exemplary embodiment of the present disclosure may include a channel having improved width uniformity through the lower channel LCH and the upper channel UCH formed in a sequential process.

As described above with reference to FIG. 25, string select lines and ground select lines may be arranged on upper and lower portions of the word lines 6630 and 6730, respectively. According to an exemplary embodiment of the present disclosure, a word line adjacent to the string select line or a word line adjacent to the ground select line may be a dummy word line. In the memory device 6500 according to an embodiment, a word line placed near a boundary between the lower channel LCH and the upper channel UCH may be a dummy word line. For example, the word line 6634 and the word line 6635 forming the boundary between the lower channel LCH and the upper channel UCH may be dummy word lines.

In the bit line bonding region BLBA, the first cell region CELL1 may include a first through electrode THV1, and the second cell region CELL2 may include a second through electrode THV2. The first through electrode THV1 may penetrate the common source line 6620 and the plurality of word lines 6630. The first through electrode THV1 may further penetrate the third substrate 6610. The first through electrode THV1 may include a conductive material. Alternatively, the first through electrode THV1 may include a conductive material surrounded by an insulating material. The second through electrode THV1 may be the same as the first through electrode THV1. The first through electrode THV1 and the second through electrode THV2 may be electrically connected through the first through upper metal pattern 6672*b* and the second through lower metal pattern 6771*d*. The first through upper metal pattern 6672*b* may be formed on the top of the first upper chip including the first cell region CELL1, and the second through lower metal pattern 6771*d* may be formed on the bottom of the second upper chip including the second cell region CELL2. The first through electrode THV1 may be electrically connected to the first metal layer 6650*c* and the second metal layer 6660*c*. A first through via 6671*b* may be formed between the second metal layer 6660*c* and the first through upper metal pattern 6672*b*. A second through via 6772*d* may be formed between the second through electrode THV2 and the second through lower metal pattern 6771*d*. The first through upper metal pattern 6672*b* and the second through lower metal pattern 6771*d* may be connected in a bonding manner.

According to an embodiment of the present disclosure, a first upper metal pattern 6672*a* may be formed on the top of the first cell region CELL1, and a first lower metal may be formed on the bottom of the second cell region CELL2. The first upper metal pattern 6672*a* of the first cell region CELL1 and the first lower metal pattern 6771*e* of the second cell region CELL2 may be connected in the external pad bonding region PA by a bonding method. A second upper metal pattern 6772*a* may be formed on the top of the second cell region CELL2, and a second lower metal pattern 873*a* may be formed on the bottom of the peripheral circuit region PERI. The second upper metal pattern 6772*a* of the second cell region CELL2 and the second lower metal pattern 873*a* of the peripheral circuit region PERI may be connected in the external pad bonding region PA by a bonding method.

In an embodiment, each of the first cell region CELL1 and the second cell region CELL2 may comprise a plurality of memory blocks. For example, the memory blocks of the first cell region CELL1 and the memory blocks of the second cell region CELL2 may be independent of each other. For example, a memory block of the first cell region CELL1 and a memory block of the second cell region CELL2 may be managed as a super block. The super block may be erased simultaneously or independently. The super block may be opened for writing or closed for prevention of further writing together or independently.

As described above referring to FIG. 25, the first cell region CELL1 and the second cell region CELL2 may comprise the memory cell array 110 of FIG. 1. The peripheral circuit region PERI may comprise the address decoder 120, the read and write circuit 130, and the control logic and voltage generator 140 of FIG. 1.

Each ground selection line GSL may correspond to at least two string selection lines SSL. Each ground selection line GSL may be connected to cell strings which are connected to at least two string selection lines SSL. Cell strings of each memory block may be connected to at least two ground selection lines GSL.

Reading data from memory cells of a selected memory block may comprise a preset operation and a read operation. Voltages applied to the first cell region CELL1 and/or the second cell region CELL2 may be the same as described above referring to FIG. 25. In an embodiment, when reading data from one of the first cell region CELL1 and the second cell region CELL2, the voltages may be applied to the one as described above referring to FIG. 25. Another one of the first cell region CELL1 and the second cell region CELL2 may be supplied with no voltage or default voltages for maintaining current state.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A method of performing a read operation in a nonvolatile memory comprising a memory cell region and a peripheral circuit region, the memory cell region comprising multiple cell strings each comprising multiple memory cells stacked in a direction perpendicular to a substrate, a ground selection transistor disposed between the memory cells and the substrate, and a string selection transistor disposed between the memory cells and a bitline, the method comprising:

during a first interval:
applying, by the peripheral circuit region to the memory cell region, a first turn-on voltage to string selection lines connected to string selection transistors of a first group of cell strings among the multiple cell strings, and to a first ground selection line connected in common to ground selection transistors of the first group of cell strings; and
applying, by the peripheral circuit region to the memory cell region, a second turn-on voltage to string selection lines connected to string selection transistors of a second group of cell strings among the multiple cell strings, and to a second ground selection line connected in common to ground selection transistors of the second group of cell strings;

during a second interval following the first interval:
applying, by the peripheral circuit region to the memory cell region, the first turn-on voltage to a string selection line of a selected cell string among the first group of cell strings, and to the first ground selection line; and
applying, by the peripheral circuit region to the memory cell region, a turn-off voltage to string selection lines of unselected cell strings among the first group of cell strings, to string selection lines of cell strings in the second group of cell strings, and to the second ground selection line; and during both the first and second intervals:
applying, by the peripheral circuit region to the memory cell region, a first read voltage to a selected wordline among wordlines connected to memory cells of the first group of cell strings and the second group of cell strings; and
applying, by the peripheral circuit region to the memory cell region, a second read voltage to unselected wordlines among the wordlines connected to memory cells of the first group of cell strings and the second group of cell strings of the wordlines, wherein the memory cell region further comprises first metal pads,
wherein the peripheral circuit region comprises second metal pads and is vertically connected to the memory cell region by the first metal pads and the second metal pads.

2. The method of claim 1, wherein the first group of cell strings and the second group of cell strings are connected to the same bitline.

3. The method of claim 1, wherein the first read voltage is lower than the second read voltage.

4. The method of claim 3, wherein the first turn-on voltage is substantially equal to the first read voltage.

5. The method of claim 1, wherein the second turn-on voltage is lower than the first turn-on voltage.

6. The method of claim 1, wherein the first turn-on voltage is substantially equal to the second turn-on voltage.

7. The method of claim 6, wherein the peripheral circuit region is connected to at least one of the string selection lines, the first ground selection transistor, the second ground selection transistor, the wordlines and/or the bitline through the first metal pads and the second metal pads.

8. The method of claim 1, wherein the memory cell region is formed on a first wafer and the peripheral circuit region is formed on a second wafer.

9. The method of claim 1, wherein the first metal pads and the second metal pads are connected by bonding manner.

10. The method of claim 1, wherein the first metal pads and the second metal pads are formed of copper.

11. A nonvolatile memory, comprising:
a memory cell region comprising first metal pads and a memory cell array, the memory cell array comprising multiple cell strings each cell string comprising multiple memory cells stacked in a direction perpendicular to a substrate, a ground selection transistor disposed between the memory cells and the substrate, and a string selection transistor disposed between the memory cells and a bitline; and
a peripheral circuit region,
wherein the peripheral circuit region comprises:
second metal pads;
an address decoder connected to multiple memory cells of the cell strings through wordlines, to string selection transistors of the cell strings through string selection lines, and to ground selection transistors of the cell strings through ground selection lines; and
a read/write circuit connected to string selection transistors of the cell strings through bitlines,
wherein, in a read operation, the address decoder applies a turn-on voltage to string selection lines and ground selection lines connected to the string selection transistors and ground selection transistors, respectively, and then applies a turn-off voltage to unselected string selection lines and unselected ground selection lines among the string selection lines and ground selection lines while continuing to apply the turn-on voltage to a selected string selection line and a selected ground selection line among the string selection lines and ground selection lines, and
wherein the peripheral circuit region is vertically connected to the memory cell region by the first metal pads and the second metal pads.

12. The nonvolatile memory of claim 11, wherein the cell strings are arranged on the substrate in rows and columns, a row of cell strings is connected in common to a string selection line, two or more rows of cell strings are connected in common to a ground selection line, and the cell strings are connected to two or more ground selection lines.

13. The nonvolatile memory of claim 12, wherein when the turn-on voltage is applied, the address decoder is controlled such that a first voltage level of the unselected ground selection lines and unselected string selection lines corresponding to the unselected ground selection lines is different from a second voltage level of an unselected string selection line corresponding to a selected ground selection line.

14. The nonvolatile memory of claim 13, wherein the first voltage level is higher than the second voltage level.

15. The nonvolatile memory of claim 12, wherein cell strings in a column are connected in common to a bitline.

16. The nonvolatile memory of claim 12, wherein memory cells, placed at the same height on the substrate, from among memory cells in the cell strings are connected in common to a wordline.

17. A method of performing a read operation in a nonvolatile memory comprising a memory cell region and a peripheral circuit region, the memory cell region comprising multiple cell strings each comprising multiple memory cells stacked in a direction perpendicular to a substrate, a ground selection transistor disposed between the memory cells and the substrate, and a string selection transistor disposed between the memory cells and a bitline, the method comprising:
in a first interval of the read operation, applying, by the peripheral circuit region to the memory cell region, a turn-on voltage to string selection lines and ground selection lines connected to the string selection transistors and the ground selection transistors, respectively;
in a second interval following the first interval, applying, by the peripheral circuit region to the memory cell region, a turn-off voltage to unselected string selection lines and unselected ground selection lines among the string selection lines and ground selection lines while continuing to apply the turn-on voltage to a selected string selection line and a selected ground selection line among the string selection lines and ground selection lines; and
in both the first and second intervals, applying, by the peripheral circuit region to the memory cell region, a first read voltage to a selected wordline connected to memory cells to be read by the read operation and applying a second read voltage to unselected wordlines among connected to memory cells not to be read by the read operation,
wherein the memory cell region further comprises first metal pads,
wherein the peripheral circuit region comprises second metal pads and is vertically connected to the memory cell region by the first metal pads and the second metal pads.

18. The method of claim 17, wherein the turn-on voltage is discharged at the unselected string selection lines and the unselected ground selection lines before voltages of the unselected string selection lines and the unselected ground selection lines reach a target level of the turn-on voltage.

19. The method of claim 18, wherein applying the first read voltage includes:
applying a wordline turn-on voltage during the first interval; and
applying a read voltage during the second interval.

20. The method of claim 17, wherein the turn-on voltage increase at the selected string selection line and the selected ground selection line when the read operation enters the second interval.

* * * * *